United States Patent
Cozzan et al.

(10) Patent No.: US 11,286,419 B2
(45) Date of Patent: Mar. 29, 2022

(54) CE:YAG/Al$_2$O$_3$ COMPOSITES FOR LASER-EXCITED SOLID-STATE WHITE LIGHTING

(71) Applicant: THE REGENTS OF THE UNIVERSITY OF CALIFORNIA, Oakland, CA (US)

(72) Inventors: Clayton J. Cozzan, Goleta, CA (US); Steven P. DenBaars, Goleta, CA (US); Ram Seshadri, Goleta, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 16/320,295

(22) PCT Filed: Jul. 31, 2017

(86) PCT No.: PCT/US2017/044724
§ 371 (c)(1),
(2) Date: Jan. 24, 2019

(87) PCT Pub. No.: WO2018/023125
PCT Pub. Date: Feb. 1, 2018

(65) Prior Publication Data
US 2019/0264100 A1     Aug. 29, 2019

Related U.S. Application Data

(60) Provisional application No. 62/368,614, filed on Jul. 29, 2016.

(51) Int. Cl.
*C09K 11/02* (2006.01)
*F21K 9/64* (2016.01)
(Continued)

(52) U.S. Cl.
CPC ............ *C09K 11/02* (2013.01); *C04B 35/10* (2013.01); *C04B 35/117* (2013.01); *C04B 35/44* (2013.01);
(Continued)

(58) Field of Classification Search
None
See application file for complete search history.

(56) References Cited

U.S. PATENT DOCUMENTS 8,137,587 B2 * 3/2012 Miyagawa .............. C04B 35/44
                                                    252/301.4 R
2003/0068438 A1    4/2003   Vaddi et al.
(Continued)

OTHER PUBLICATIONS

PCT International Search Report & Written Opinion dated Jan. 3, 2018, Application No. PCT/US17/44724.

*Primary Examiner* — Edwin C Gunberg
(74) *Attorney, Agent, or Firm* — Gates & Cooper LLP

(57) ABSTRACT

A method for fabricating a composite useful in a white light emitting device, includes mixing a phosphor and a filler to form a mixture; sintering the mixture (e.g., using spark plasma sintering) to form a composite; and annealing the composite to reduce oxygen vacancies and improve optical properties of the composite. Also disclosed is a white light emitting device including a laser diode or light emitting diode optically pumping the phosphor in the composite to produce white light. The composite fabricated using the method (and having. e.g., at most 50% phosphor by weight) can (1) reduce an operating temperature of the phosphor by 55 degrees, (2) increase an external quantum efficiency (e.g., by at least 15%) of the white light emitting device, and (3) result in color points and quality of the white light that is equal to or improved, as compared to without the filler.

20 Claims, 15 Drawing Sheets

(51) Int. Cl.
*F21K 9/68* (2016.01)
*C04B 35/10* (2006.01)
*C04B 35/44* (2006.01)
*C04B 35/645* (2006.01)
*C09K 11/77* (2006.01)
*C04B 35/117* (2006.01)
*H01L 33/50* (2010.01)
*H05B 33/20* (2006.01)
*H01L 31/055* (2014.01)
*H05B 33/14* (2006.01)
*F21Y 115/30* (2016.01)
*F21Y 115/10* (2016.01)

(52) U.S. Cl.
CPC ........ *C04B 35/645* (2013.01); *C09K 11/7774* (2013.01); *F21K 9/64* (2016.08); *F21K 9/68* (2016.08); *H01L 31/055* (2013.01); *H01L 33/501* (2013.01); *H01L 33/502* (2013.01); *H05B 33/14* (2013.01); *H05B 33/20* (2013.01); *C04B 2235/3217* (2013.01); *C04B 2235/3222* (2013.01); *C04B 2235/3225* (2013.01); *C04B 2235/3229* (2013.01); *C04B 2235/6562* (2013.01); *C04B 2235/6565* (2013.01); *C04B 2235/6567* (2013.01); *C04B 2235/6581* (2013.01); *C04B 2235/6582* (2013.01); *C04B 2235/662* (2013.01); *C04B 2235/664* (2013.01); *C04B 2235/666* (2013.01); *C04B 2235/77* (2013.01); *C04B 2235/80* (2013.01); *C04B 2235/9607* (2013.01); *C04B 2235/9646* (2013.01); *F21Y 2115/10* (2016.08); *F21Y 2115/30* (2016.08); *H01L 2933/0041* (2013.01); *Y02B 20/00* (2013.01); *Y02E 10/52* (2013.01)

(56) References Cited

U.S. PATENT DOCUMENTS

| | | | |
|---|---|---|---|
| 2004/0149931 | A1 | 8/2004 | Isoda |
| 2006/0091790 | A1* | 5/2006 | Nagatomi ............ C04B 35/597 313/503 |
| 2009/0002810 | A1* | 1/2009 | Jeon .................... H01L 33/505 359/361 |
| 2009/0072700 | A1* | 3/2009 | Kameshima ....... C09K 11/7774 313/483 |
| 2010/0302464 | A1 | 12/2010 | Raring et al. |
| 2013/0257264 | A1 | 10/2013 | Tamaki et al. |

* cited by examiner

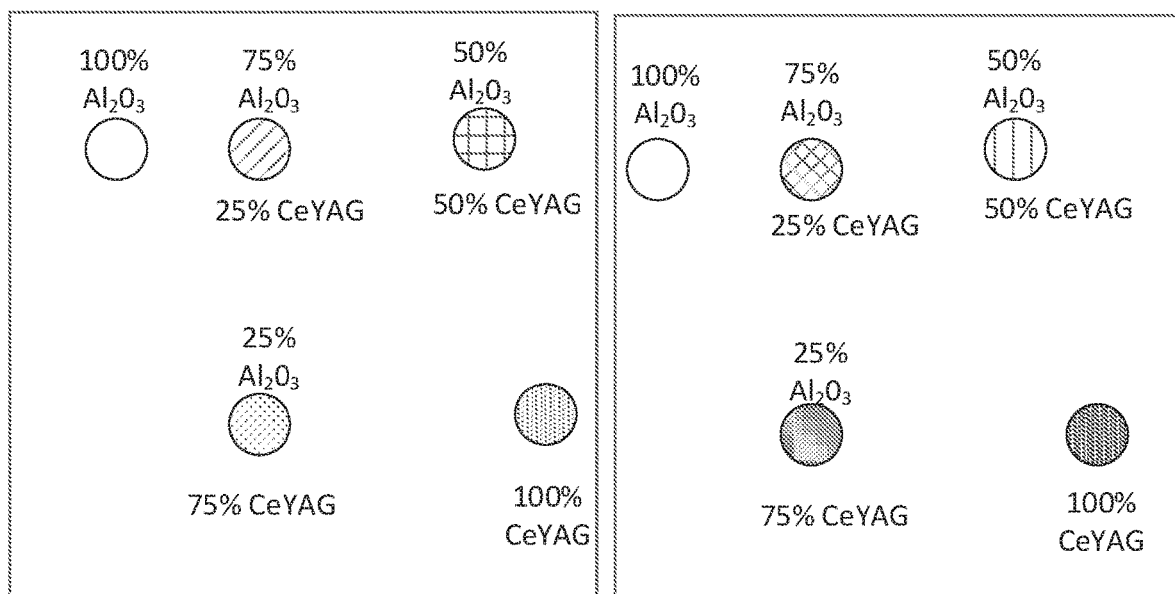
*Figure 2(a)* *Figure 2(b)*

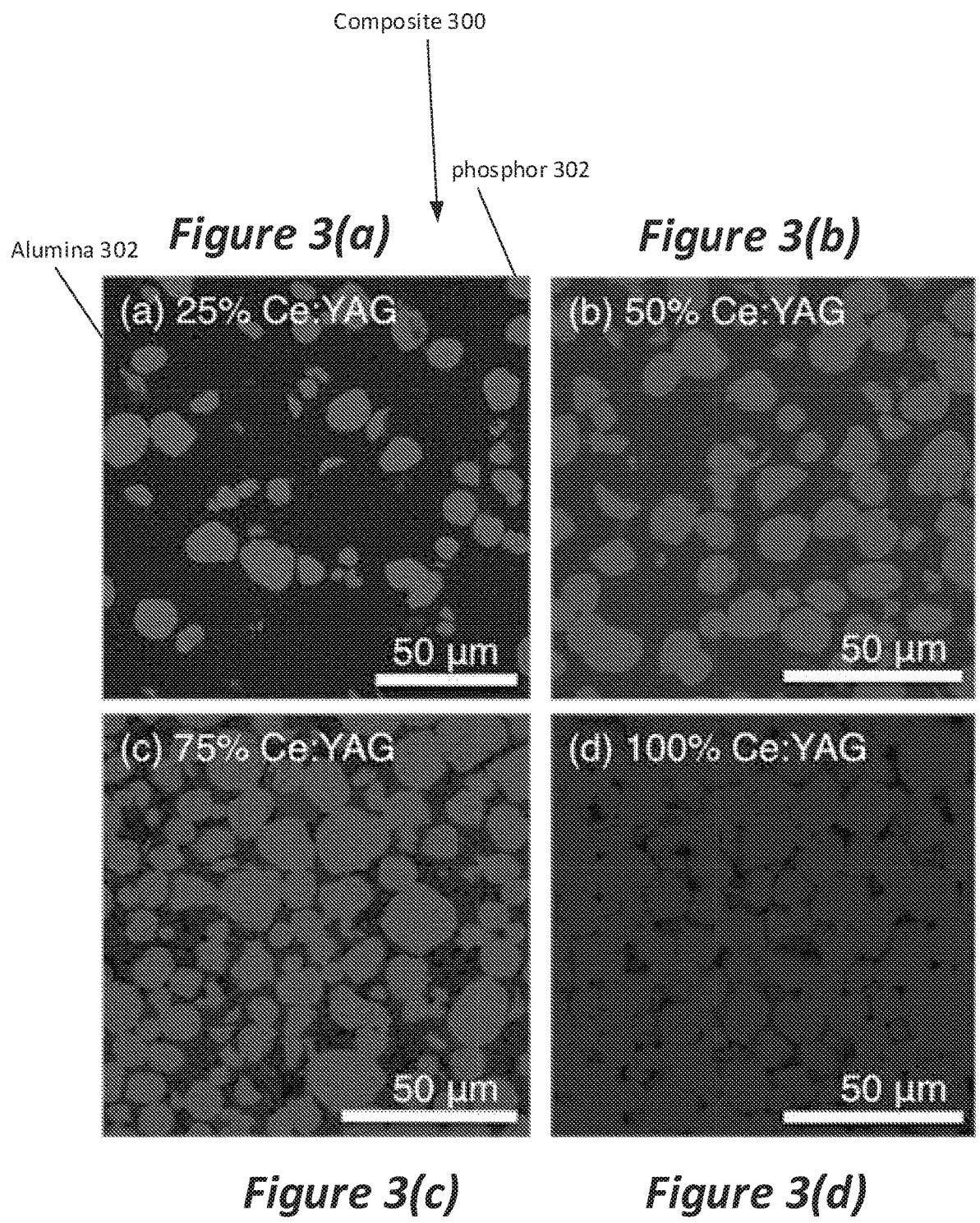
*Figure 3(a)* *Figure 3(b)*
*Figure 3(c)* *Figure 3(d)*

Figure 8(a)  Figure 8(b)  Figure 8(c)
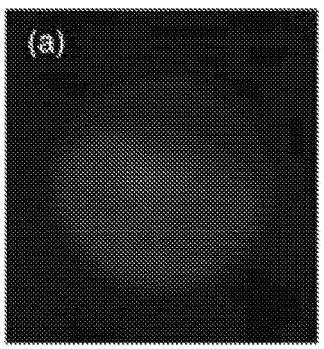 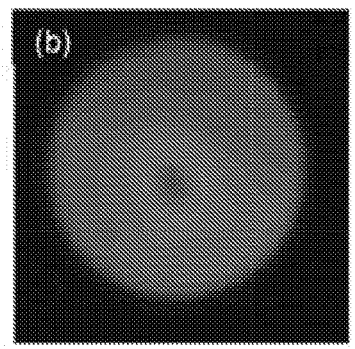 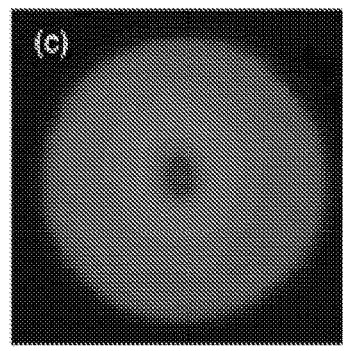
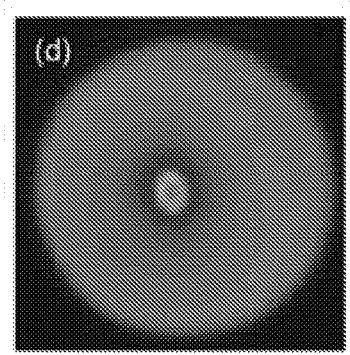 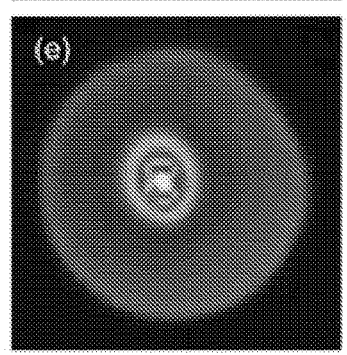
Figure 8(d)  Figure 8(e)

_# CE:YAG/Al₂O₃ COMPOSITES FOR LASER-EXCITED SOLID-STATE WHITE LIGHTING

CROSS REFERENCE TO RELATED APPLICATIONS

This application claims the benefit under 35 U.S.C. Section 119(e) of the following co-pending and commonly-assigned application:

U.S. Provisional Patent Application No. 62/368,614 filed on Jul. 29, 2016, by Clayton J. Cozzan and Ram Seshadri, entitled "Ce:YAG/Al$_2$O$_3$ COMPOSITES FOR LASER-EXCITED SOLID-STATE WHITE LIGHTING," (UC Ref. 2016-99P);

which application is incorporated by reference herein.

STATEMENT REGARDING FEDERALLY SPONSORED RESEARCH AND DEVELOPMENT

This invention was made with Government support under Cooperative Agreement No. DE-AR0000671 awarded by the U.S. Department of Energy's Advanced Research Projects Agency-Energy (ARPA-E). The Government has certain rights in this invention.

BACKGROUND OF THE INVENTION

1. Field of the Invention

The present invention is related to the fabrication of a composite comprising a phosphor for use in solid state lighting.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein).

Solid state white lighting using blue light emitting diodes (LEDs) and blue laser diodes (LDs) depends on an inorganic phosphor to absorb the solid state radiation and emit longer wavelength light. The simplest arrangement is a blue emitting solid state device with a cerium doped yttrium aluminum garnet (Ce:YAG) phosphor [43], although other inorganic phosphors consisting of a host structure with optically active rare earth ions such as Eu$^{2+}$ may also be used to absorb the spectrally narrow solid-state device excitation and emit a broader spectrum at higher wavelengths, allowing for color mixing that produces white light. In one example, the rare earth ion (Cerium, Ce) is doped in small amounts, substitutes in the YAG lattice for the Y atom, and enables optical transitions [43]. Ce:YAG has been reported to have a thermal conductivity of 9.2 W/mK [44]. For commercial uses (e.g., using LEDs), the phosphor or mixture of phosphors (typically a solid powder prepared using solid state preparation techniques) needs to be encapsulated or contained. Current phosphor encapsulation schemes involve a component that either lowers the thermal stability of the device (such as an epoxy resin or silicone that is mixed with the phosphor and then cured [45]), or decreases the potential operating temperature of the device (such as mixing the phosphor with a glass at the glass melting temperature >570° C. or ~300 K [46]).

For high power and directional light applications where light emitting diode (LED) solutions fall on technological and fundamental limits, laser diodes (LDs) represent a promising path forward [1]. Thanks to their monochromatic, highly coherent, and directional light emission, LDs coupled to a small inorganic phosphor allow a quasi-point source of white light with a smaller etendue compared to conventional LED systems. If used with appropriate secondary optics, highly directional lighting devices with smaller sizes and thus smaller device footprints can be developed, which means that more devices with higher luminous outputs can be made with fewer materials, improving cost and reducing environmental impact [2]. During operation, the carrier density is clamped at its threshold value resulting in no droop at high current densities [3]. For this reason, peak efficiencies in LDs occur at much higher current densities than in LEDs, with state of the art blue LDs at threshold of 4 kW cm$^{-2}$, greatly exceeding that of LEDs at 3 W cm$^{-2}$[3]. In 2002, Murota and colleagues explored laser-stimulated white lighting using a cerium-doped yellow-emitting yttrium aluminum garnet (YAG:Ce) single crystal and a blue LD, reporting a maximum luminous efficacy of 470 lm W$^{-1}$ [4]. Further demonstrations by Denault et al. established the viability of both cool and warm laser-based white lighting using phosphors mixed with silicone and low operating currents [5]. A key design requirement for using lasers is the development of phosphor morphologies capable of withstanding high conversion and therefore high thermal loading due to the higher fluency from LDs. While organic resins are appropriate for LEDs that operate at lower temperatures, they are not suitable for the higher flux imposed by LDs and will carbonize during operation [9].

Thermal stability of phosphor emission is well-studied and understood for many canonical phosphor systems. Lower efficiencies are observed at elevated temperatures for a given dopant concentration known as quenching, and more quenching is observed as dopant amount in a phosphor is increased for a given temperature [10].

This loss in emission intensity comes from several fundamental mechanisms. For example, in the widely used Ce-doped YAG phosphor, quenching at high temperatures occurs due to thermal ionization [11]. Additionally, the Stokes shift, which is the inherent energy difference between the excited and emitted wavelength, contributes to energy loss during conversion. These mechanisms generate heat and can degrade the performance of the phosphor. To mitigate quenching that will reduce light output when combined with high flux semiconductors, the phosphor morphology used must have enough thermal conductivity to dissipate heat generated. In recent years, many different strategies have been explored to replace silicone, which has a low thermally conductivity of 0.18 W m$^{-1}$ K$^{-1}$ and can turn from transparent to yellow or brown around typical operating temperatures of LEDs [8,12,13]. Phosphor-in-glass, a strategy involving the mixture of phosphor powders with glass frit at low temperatures of <1000° C., shows an order of magnitude increase in thermal conductivity to 2.18 W m$^{-1}$ K$^{-1}$, which is higher than the soda lime glass itself, which is 0.97 W m$^{-1}$ K$^{-1}$ [8]. However, in use, it was reported that reflection losses of the excitation light led to a lower luminous efficacy in the phosphor-in-glass than in silicone-based commercial white LEDs [14].

Therefore, organic resins and glasses are appropriate for light emitting diodes that operate at low temperatures, but are not suitable for the higher flux imposed by high power LEDs or LDs. Thus, there is a need in the art for improved methods for achieving high power solid-state lighting systems. The present invention satisfies this need.

SUMMARY OF THE INVENTION

To overcome the limitations described above, and to overcome other limitations that will become apparent upon reading and understanding this specification, one or more embodiments of the present invention disclose a method for generating a stand-alone ceramic phosphor composite for use in solid state white light generating devices. The stand-alone composite successfully reduces the operating temperature of the phosphor material by 50% or more, increases lumen output, reduces cost of materials, and decreases preparation time.

In one or more embodiments, the composite consists of a phosphor material (e.g., $Y_{3-x}Ce_xAl_5O_{12}$ (Ce:YAG)) and a filler oxide (e.g., $Al_2O_3$). This Ce:YAG phosphor material is an ultraviolet (UV) and blue absorbing inorganic phosphor material that converts blue light to yellow with very high quantum efficiency (the rare earth ion, Ce, doped in small amounts, substitutes in the YAG lattice for the Y atom, and enables optical transitions [43]). By mixing $Al_2O_3$ and Ce:YAG powders and consolidating using Spark Plasma Sintering (SPS), the maximum temperature of the ceramic under laser flux is observed to decrease by 55 degrees. This ceramic phosphor mixture is not transparent and instead scatters light, leading to high light outputs when irradiated by a LD. Additionally, no further encapsulation (such as an inorganic resin) is required to hold the phosphor ceramic as the sample is sufficiently dense.

In one or more embodiments of the present invention, a method for fabricating a composite, comprises mixing one or more phosphors and one or more fillers to form a mixture; sintering the mixture to form a composite; and annealing the composite, wherein carbon content in the ceramic is reduced and optical properties of the composite are improved.

To better illustrate the composition of matter and methods described herein, a non-limiting list of examples is provided here:

In Example 1, the phosphor is an oxide phosphor that can withstand the temperature and atmosphere used in the sintering, the filler is any oxide with higher thermal conductivity than the phosphor, and the filler serves to scatter instead of absorb light.

In Example 2, the phosphor of Example 1 comprises Ce:YAG and the filler comprises $Al_2O_3$.

In Example 3, the composite of one or any combination of Examples 1-2 comprises a phosphor:filler ratio having any ratio by weight.

In Example 4, the weight of the phosphor in the composite of one or any combination of Examples 1-3 is at most 50% of the weight of the composite.

In Example 5, the sintering of one or any combination of Examples 1-4 is spark plasma sintering.

In Example 6, the method of one or any combination of Examples 1-5 further includes sintering comprising rapidly heating the mixture under a pressure, wherein a temperature of the mixture is increased at a rate of <500 degrees Celsius per minute and held at a maximum temperature less than the melting temperature of the constituents in the mixture, the pressure is in a range of <10 kilonewtons (KN), and the sintering is performed in a time of 5 hours (h) or less.

The present disclosure further describes a white light-emitting device for emitting white light, comprising a light emitting device that emits first electromagnetic radiation; and a composite comprising a phosphor sintered with a filler, wherein the first electromagnetic radiation is incident on the composite so as to reflect off a surface of the composite at an angle less than 90 degrees with respect to the surface of the composite, the composite scatters the first electromagnetic radiation so as to form second electromagnetic radiation; and a combination of the first electromagnetic radiation and the second electromagnetic radiation is white light.

To better illustrate the composition of matter and methods described herein, a non-limiting list of examples is provided here:

In Example 7, the phosphor is a ceramic and the filler comprises a material with higher thermal conductivity than the phosphor.

In Example 8, the filler of any preceding example is $Al_2O_3$ and the phosphor is Ce:YAG.

In Example 9, the phosphor of one or any combination of Examples 1-8 has a weight that is 25%-75% of the weight of the composite.

In Example 10, the phosphor of one or any combination of Examples 1-9 has a weight that is at most 60% of the weight of the composite.

In Example 11, an amount of the filler of one or any combination of Examples 1-10 reduces an operating temperature of the phosphor, increases an external quantum efficiency of the white light emitting device, and results in color points and quality of white light that is equal to or improved, as compared to without the filler.

In Example 12, the composite of one or any combination of Examples 1-11 has a density of at least 50%.

In Example 13, the composite of one or any combination of Examples 1-12 is self-encapsulating.

In Example 14, the light emitting device of one or any combination of Examples 1-13 is a laser operating above threshold or a Light Emitting Diode operating before droop.

In Example 15, the first electromagnetic radiation in one or any combination of Examples 1-14 is blue or near UV light (e.g., below 470 nm wavelength) and the second electromagnetic radiation is blue, green, red, and/or yellow light.

In Example 16, the composite in the device of one or any combination of Examples 7-15 has an operating temperature reduced by at least 30%, increases an external quantum efficiency of the white light emitting device by at least 15%, has a Lambertian emission, and results in color points and quality of the white light characterized by CIE coordinates within 5% of pure white light and equal to or improved as compared to the device without the filler.

In Example 17, the surface of the composite in one or any combination of Examples 1-17 is Lambertian, exhibiting Lambertian reflectance, so that the scattering is Lambertian scattering and the second electromagnetic radiation comprises Lambertian intensity following Lambert's cosine law.

In Example 18, the light emitting device of one or any combination of Examples 1-17 is a laser diode emitting the first electromagnetic radiation having a power of at least 3 Watts and the white light has a luminous flux of at least 50 lumens.

In Example 19, the composite in the device of one or any combination of Examples 7-18 or any preceding Example is fabricated using the methods described herein (e.g., using one or any combination of Examples 1-6.

BRIEF DESCRIPTION OF THE DRAWINGS

Referring now to the drawings in which like reference numbers represent corresponding parts throughout:

FIGS. 2(a) and 2(b) show densified samples fabricated using the method of FIG. 1, before (FIG. 2(a)) and after (FIG. 2(b) a 1000° C. anneal in air for 3 hours (h). Improvement in color reflects mitigation of oxygen vacancies.

FIGS. 3(a)-3(d) show Scanning Electron Microscope (SEM) micrographs of the densified samples having FIG. 3(a): 25% Ce:YAG, FIG. 3(b): 50% Ce:YAG, FIG. 3(c): 75% Ce:YAG, and FIG. 3(d) 100% Ce:YAG, wherein Ce:YAG particles of approximately 10 microns are well-dispersed in an alumina matrix and the dark regions in the 1000% Ce:YAG (d) are likely pores.

FIGS. 4(a)-4(c) show absorption by and emission from the densified samples in FIGS. 2(a)-2(c)-3(a)-3(d), wherein FIG. 4(a) shows the absorption of the 445 nm laser beam by the densified samples and the resulting emission from the densified samples, the absorption peak in FIG. 4(b) (magnification of the absorption in FIG. 4(a)) shows the most absorption is for the 100% Ce:YAG sample and the most reflected light is from the 25% Ce:YAG sample, and the emission profiles in FIG. 4(c) show the most reabsorption is in the 100% Ce:YAG sample, as indicated by the red shifted emission profile. Reducing reabsorption is another benefit of one or more embodiments of the present invention.

FIGS. 8(a)-8(e) show temperature of the samples of FIGS. 2(a)-2(c)-3(a)-3(d), under laser irradiation, for the following compositions FIG. 8(a): 0% Ce:YAG/100% $Al_2O_3$, FIG. 8(b) 25% Ce:YAG/75% $Al_2O_3$, FIG. 8(c) 50% Ce:YAG/50% $Al_2O_3$, FIG. 8(d) 75% Ce:YAG/25% $Al_2O_3$, and FIG. 8(e) 100% Ce:YAG/0% $Al_2O_3$. Temperature decreases as a function of increasing $Al_2O_3$ weight percent, showing a reduction of 50% in the 50% Ce:YAG/50% $Al_2O_3$ sample when compared to 100% Ce:YAG/0% $Al_2O_3$.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Technical Description

Solid state lighting using higher power sources, such as high power blue LEDs and blue LDs, depends on an inorganic phosphor to absorb the solid state radiation and emit longer wavelengths. Conventional solid state lighting uses an encapsulated inorganic phosphor to absorb the solid state radiation and emit longer wavelengths. However, encapsulations using an inorganic resin are limited to low powers as the silicone or epoxy is prone to overheating, leading to yellowing of the resin or burning [44].

Other schemes, including the development of transparent phosphor ceramics and single crystals, have been investigated recently as they negate the need of an organic component and are useful for LEDs with light transmitting through the converter [45, 46]. However, the transparent Ce:YAG ceramics are often prepared using vacuum sintering, which takes on the order of hours but offers compositional control. Single crystal growth, typically using the Cz-growth method, has a growth rate on the order of 1 mm/hour and is limited to low Ce amounts (<0.3 at %) in Ce:YAG. The peak efficiency of Ce:YAG occurs closer to 2-3 at % Ce.

In the present invention, the Ce:YAG is prepared using a much faster and more versatile technique. The method used is SPS, which can be utilized to prepare transparent or opaque samples of multiple components of varying dopant amounts. Some reports have shown the preparation of phosphors using this method, but the resulting phosphor pellets are ground up after preparation to be studied [48-52]. In one or more embodiments of the present invention, the emphasis is on using SPS to consolidate already prepared oxides of the desired phases into dense samples [47]. The oxides to be mixed must not decompose or form impurities when heated in a reducing atmosphere, which makes many oxide phosphors eligible for this technique. SPS prepares dense samples using lower temperatures than either single crystal growth or vacuum sintering and takes a fraction of the time (~30 min). This freedom allows the densification of oxide phosphors with filler materials, where the phosphors are not dopant amount limited and the amount of phosphor to filler is not limited by eutectic compositions.

Example Fabrication

Figure 1:
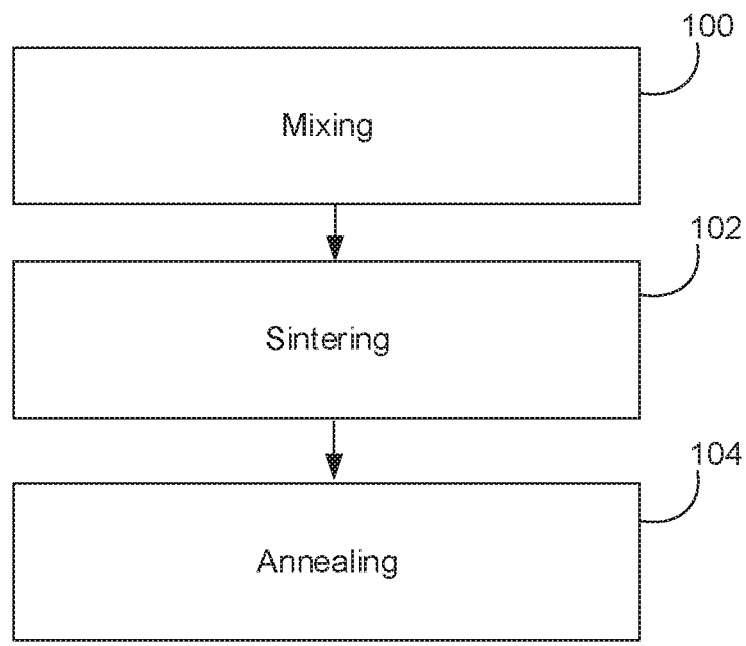
FIG. 1 is a flowchart illustrating a method of fabricating a composite.

FIG. 1 is a flowchart illustrating a method of fabricating a composite according to one or more embodiments of the invention.

Block 100 represents preparing a mixture (mixing a phosphor and a filler to form the mixture). For the data presented herein, mixtures of commercially available Ce-doped yttrium aluminum garnet ($Y_3Al_5O_{12}:Ce^{3+}$, or Ce:YAG) and alpha phase alumina ($\alpha$-$Al_2O_3$, Sigma Aldrich, 99.99%) were used as examples and the following mixtures of the $Al_2O_3$ (as a filler) and the Ce:YAG by weight were prepared and measured: samples of 0% Ce:YAG/100% $Al_2O_3$, 25% Ce:YAG/75% $Al_2O_3$, 50% Ce:YAG/50% $Al_2O_3$, 75% Ce:YAG/25% $Al_2O_3$, and 100% Ce:YAG/0% $Al_2O_3$. The starting oxides ($Al_2O_3$, 99.99%) and Ce-YAG were weighed out and mixed with an alumina mortar and pestle with care taken to just mix the samples (i.e., care was taken to not grind the samples). 0.75 grams (g) of each mixture was weighed out and placed into the SPS die set with 10 mm diameter cavity with 1 mm thick graphite foil lining the die.

However, other oxides can be used as the filler and other ceramics can be used as the phosphor. In one or more embodiments, the phosphor is an oxide phosphor that can withstand the temperature and atmosphere used in the sintering, the filler is any oxide with higher thermal conductivity than the phosphor, and the filler serves to scatter instead of absorb light.

Block 102 represents sintering or densifying the mixture using SPS to form a composite. In this embodiment, the phosphor ceramics were prepared via the SPS technique using a FCT Systeme GmbH SPS furnace. SPS is a materials preparation method that utilizes an electrical current to achieve Joule heating in powders with pressure applied concomitantly to increase contact of grains. High heating rates mitigate sintering mechanisms (such as grain coarsening) and promote densification in a process that typically takes ~30 min, resulting in very dense and robust samples [47]. Different than single crystal growth, SPS allows mixtures of different starting oxides to be prepared in any ratio, allowing immense design flexibility. Additionally, SPS can achieve near theoretical density, resulting in very robust samples [47].

For the data presented herein, the sample chamber was pumped down to vacuum with a preload of 3 kN applied, and subsequently increased to 5 kN or 8 kN over 30 s once vacuum was achieved. The sample was heated up to 1200-1500° C. at a rate of 200° C. min$^{-1}$ with a 5 min hold, and then finally cooled to room temperature in 10 min. For the data presented in FIGS. 3(a)(3d)-6, pressure was increased from 3 kilonewtons (kN) to 5 kN, the sample was heated at 200° C./min to 450° C. followed by 100° C./min to a maximum temperature 1100-1500° C., with a 5 min hold at the maximum temperature. The maximum temperature was increased with increasing Ce:YAG content, as Ce:YAG was observed to densify at a higher temperature than the $Al_2O_3$. The hold temperatures, from 0% Ce:YAG to 100% Ce:YAG, were 1150° C. (0% Ce:YAG), 1150° C. (25% Ce:YAG), 1200° C. (50% Ce:YAG), 1250° C. (75% Ce:YAG), and 1350° C. (100% Ce:YAG). This resulted in different densities for each sample.

Other sintering or combining techniques can be used. In one or more embodiments, the combining (coalescing, sintering, densifying) comprises rapidly heating the mixture under a pressure, wherein a temperature of the mixture is increased at a rate of <300 or <500 degrees Celsius per minute and held at a maximum temperature less than the melting temperature of the constituents in the mixture, the pressure is in a range of <10 KN, and the sintering/combining is performed in a time of 5 hours or less.

In one or more embodiments, the composite comprises a phosphor:filler ratio having any ratio by weight (in one or more examples, the weight of the phosphor in the composite is at most 50% of the weight of the composite).

The samples may be sanded to remove the graphite foil.

Block 104 represents annealing the composite, e.g., wherein carbon content in the ceramic is reduced and optical properties of the composite are improved.

SPS relies on graphite and carbon based tooling surrounding the powder, resulting in a carbon-rich densification environment. After densification, the samples appeared dark in color, instead of yellow Ce:YAG and white $Al_2O_3$ after SPS due to the presence of carbon, which was evidenced by lower in-line transmission in other transparent oxides prepared using SPS [34]

Figure 2C:
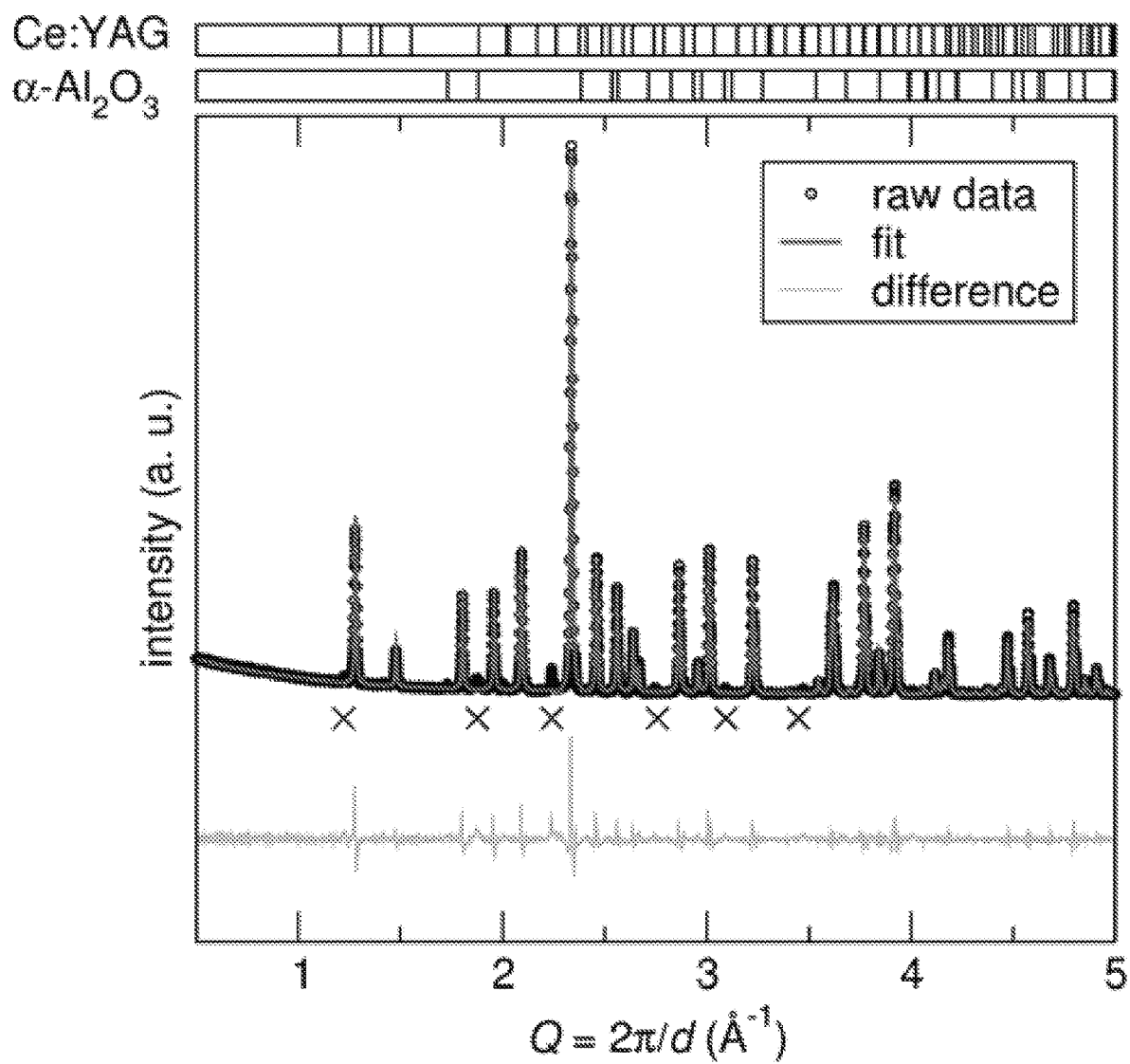
FIG. 2(c): Rietveld refinement of powder from an SPS-prepared 50:50 nominally by weight Al2O3/Ce:YAG sample is shown, with phase ticks identifying peaks for both phases, and X marking impurity phases in the starting materials. Results of the refinements indicate phase fractions of 51.4% Al2O3 and 48.6% Ce:YAG, providing evidence to the compatibility of the two materials.

For the data in FIGS. 3(a)-3(d)-6, samples were then heated at 1000° C. for 3 h to reduce the amount of oxygen vacancies, which leads to visible improvements in the color of the samples (FIGS. 2(a)-2(b)). For the remaining data, sintered/densified samples were annealed in an alumina crucible using a Lindberg tube furnace with an alumina tube under 0.1 L min$^{-1}$ of 5% H2:95% Ar with the following heating regimen: 2° C. min$^{-1}$ heating to 1500° C., 6 h at 1500° C., and finally a 2° C. min$^{-1}$ cool to room temperature.

It is hypothesized that heating in a reducing environment mitigates carbon contamination via the formation of carbon complexes that off-gas, thereby reducing the amount of elemental carbon in the sample. Visually, the samples appeared closer to the color of the original starting powders after the annealing step.

Density of the samples was not altered by the annealing step.

The resulting samples are cylindrical with diameters of ~9 mm and thicknesses of ~3 mm.

Characterization of the Examples

Secondary Ion Mass spectrometry (SIMS)

To investigate the effect of the annealing step on the amount of carbon in the ceramics, SIMS was performed on three craters 3 to 4 microns deeper than the surface of the samples, with areas of approximately 30 mm$^2$ assessed.

SIMS was performed on a Cameca IMS-7f Auto system using Cs primary ions. A gold coat and electron flood were used to control electrical charging effects. In each sample, three 100-micron craters were made, and secondary ions were collected from the center 33 microns. The etch rate was approximately 65 nm min$^{-1}$, and composition down to a depth of 2500 to 3000 nm was investigated. Aluminum ions (27Al) were collected in addition to carbon, for purposes of normalizing the carbon results across samples. SIMS is inherently qualitative with quantitative information possible with proper standards, but proper standards for the current system are not available.

Using 27Al as a reference signal, it was confirmed by SIMS that an order of magnitude less carbon was present in the annealed sample than in the as-prepared by SPS with no anneal.

X-Ray Diffraction

X-ray powder diffraction of the starting materials and the powder obtained from grinding sintered samples with an agate mortar and pestle were performed at room temperature using a Panalytical Empyrean powder diffractometer. The calibrated wavelength was $\lambda=Å$. Powder was placed on a zero background silicon holder and scans were 1 h in duration. Rietveld refinement of the diffraction data was performed using the General Structure Analysis System (GSAS) with EXPGUI [30,31].

As evidenced by the $Al_2O_3$ and $Y_2O_3$ phase diagram [28] no intermediate phases are expected when mixing and heating $Y_3Al_5O_{12}$ and $Al_2O_3$ to 1500° C. To confirm the purity of phases in the sintered ceramics, X-ray diffraction was performed on powder derived from grinding an SPS-prepared ceramic sample. Rietveld refinements of a representative 50:50 by weight sample (FIG. 2(c)) were used to obtain phase fractions, which were 51.4% $Al_2O_3$ and 48.6% Ce:YAG.

Scanning Electron Microscopy (SEM)

SEM images of the sintered samples were collected using a FEI XL30 Sirion FEG Scanning Electron Microscope in secondary electron mode with a 15 kV beam voltage. FIGS. 3(a)-3(d) show SEM backscattering images of the Ce:YAG containing samples, with the lighter region corresponding to Ce:YAG and the darker region corresponding to $Al_2O_3$.

The compatibility of $Y_3Al_5O_{12}$ and $Al_2O_3$ was also observed in the SEM, where micrographs show Ce:YAG particles distributed in an $Al_2O_3$ matrix. The particles of Ce:YAG are isolated in an $Al_2O_3$ matrix, which suggests both implications for light scattering and thermal conductivity. In Ce:YAG/$Al_2O_3$ phosphor systems, it has been noted that the refractive indices of YAG and $Al_2O_3$ are similar, which may reduce backscattering and total internal reflection losses at crystal boundaries as an increased optical path enables more efficient excitation [35]. Additionally, the inventors expect a higher thermal stability of the composites over the 100% Ce:YAG sample due to this morphology, as the connectivity of the $Al_2O_3$ offers better heat dissipation as compared to Ce:YAG particles through the higher thermal conductivity of $Al_2O_3$ during conversion in the phosphor particles [19].

Infrared (IR) Imaging

Using the same commercial LD, samples were placed on a large aluminum heat sink and monitored using a FLIR A310 thermal imaging camera with range 0° C.-360° C. The LD lens was placed 5 cm away from the surface of samples at an angle of 45°. The LD was mounted in a cylindrical copper heat sink of diameter 20 mm to mitigate laser over-heating. The samples were placed on a large metal heatsink that was much larger than the sample size, and thermally attached using a silicone-based thermal joint compound. The samples were then monitored using an infrared (IR) camera. Emissivity of the samples were set to 0.95.

Thermal Diffusivity

Thermal diffusivity was measured using a laser flash technique between room temperature and 973 K under an argon atmosphere on a Netzsch LFA 457 system with a flow rate of 100 ml min$^{-1}$. Pellets for the measurement, approximately 6 mm in diameter and 2 mm thick, were sprayed with a layer of carbon paint to minimize errors in the emissivity. The thermal conductivity was calculated using $\kappa=\alpha Cp\rho$, where $\alpha$, Cp, and $\rho$ are the thermal diffusivity, heat capacity, and density, respectively. The Cowan model [33] for determining diffusivity and the Dulong-Petit molar heat capacity (Cp=3R) were employed. To characterize reflection of incoming laser light and analyze the color over angle (COA), angular resolved experiments were carried out.

Photoluminescence

Photoluminescence spectra were collected using a 50 cm diameter integrating sphere with a commercial blue laser diode (Nichia) in a copper heat sink mounted in a side port and the phosphor sample mounted in the center of the sphere. The diode was controlled by a Keithley 2440 5A SourceMeter. Data was collected using a MAS40 spectrometer with a 2.0 OD filter. A correction factor was experimentally measured to account for the attenuation imparted by the filter. Quantum yield was calculated using a two measurement approach [32]. This data collected was then used to calculate optical properties, such as quantum yield and luminous flux, using Mathematica. Current, voltage, radiometric, and electrical power for the LD.

Characterization of White Light

Ceramic samples of varying phosphor content were prepared and measured to target the most favorable color. Values shown in Table 1 were recorded using an integrating sphere with a commercial LD mounted to the side of the sphere. The results confirm that white light near the white point (0.33, 0.33) can be achieved with 50 wt % $Al_2O_3$ and 50 wt % Ce:YAG. Moreover, ceramic samples of 50% $Al_2O_3$/50% Ce:YAG measured the lowest CCT, CIE coordinates close to the white point. The CRI is low as expected for a blue LD source coupled with a yellow-emitting phosphor [2,5]. The LD was controlled using a Keithley 2440 power source with the LD operating at low power and for less 1000 ms to avoid sample heating.

TABLE 1

Coordinated color temperature (CCT), Commission Internationale de l'Eclairage (CIE) (x, y) coordinates, and color rendering index (CRI) of ceramic composites prepared using SPS with systematically increasing amounts of Ce-doped YAG phosphor. The 50% $Al_2O_3$/50% Ce:YAG 50% ceramic shows the CIE coordinates closest to the white point with the lowest CCT.

|  | 75% $Al_2O_3$ 25% Ce:YAG | 50% $Al_2O_3$ 50% Ce:YAG | 25% $Al_2O_3$ 50% Ce:YAG | 100% Ce:YAG 75% Ce:YAG |
|---|---|---|---|---|
| CCT (K) | 12399 | 5340 | 6760 | 5872 |
| CIE (x, y) | (0.29, 0.25) | (0.34, 0.32) | (0.32, 0.28) | (0.33, 0.31) |
| CRI | 63 | 61 | 63 | 63 |

TABLE 2

PLQY measured for a commercial Ce:YAG sample, a mixture of 50% $Al_2O_3$/50% Ce:YAG, two ceramic samples of composition 50% $Al_2O_3$/50% Ce:YAG, and those ceramic samples ground into a powder and mixed in silicone.

| Sample | Powder in silicone | CIE (x, y) | Ceramic |
|---|---|---|---|
| Commercial Ce:YAG | 83-89 | (0.33, 0.35) | — |
| 50% $Al_2O_3$/50% Ce:YAG starting powders | 77-86 | (0.27, 0.19) | — |
| 50% $Al_2O_3$/50% Ce:YAG 97% theoretical density | 69-75 | (0.29, 0.27) | 48-53 |

Figure 4A:
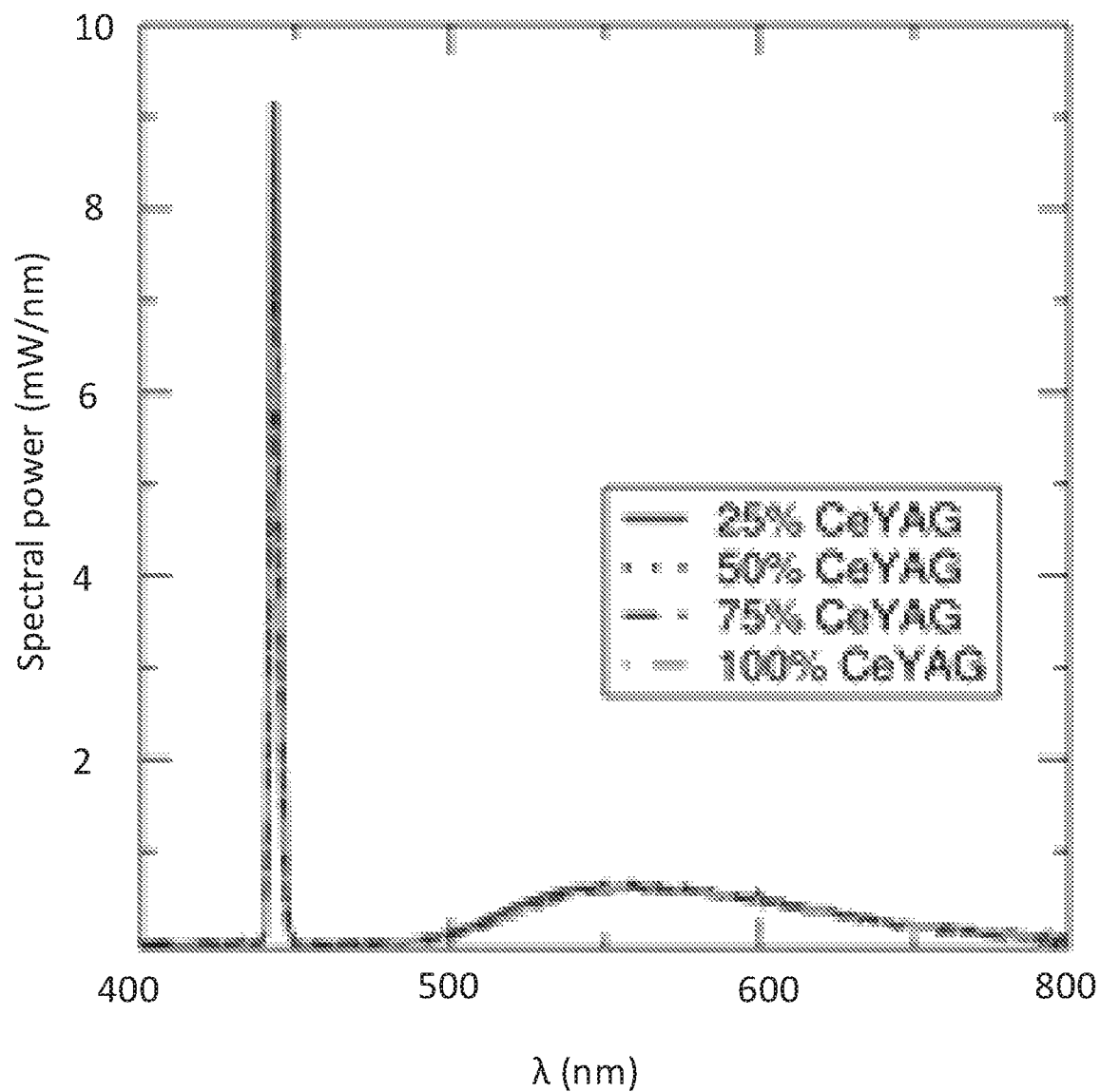
Figure 4B:
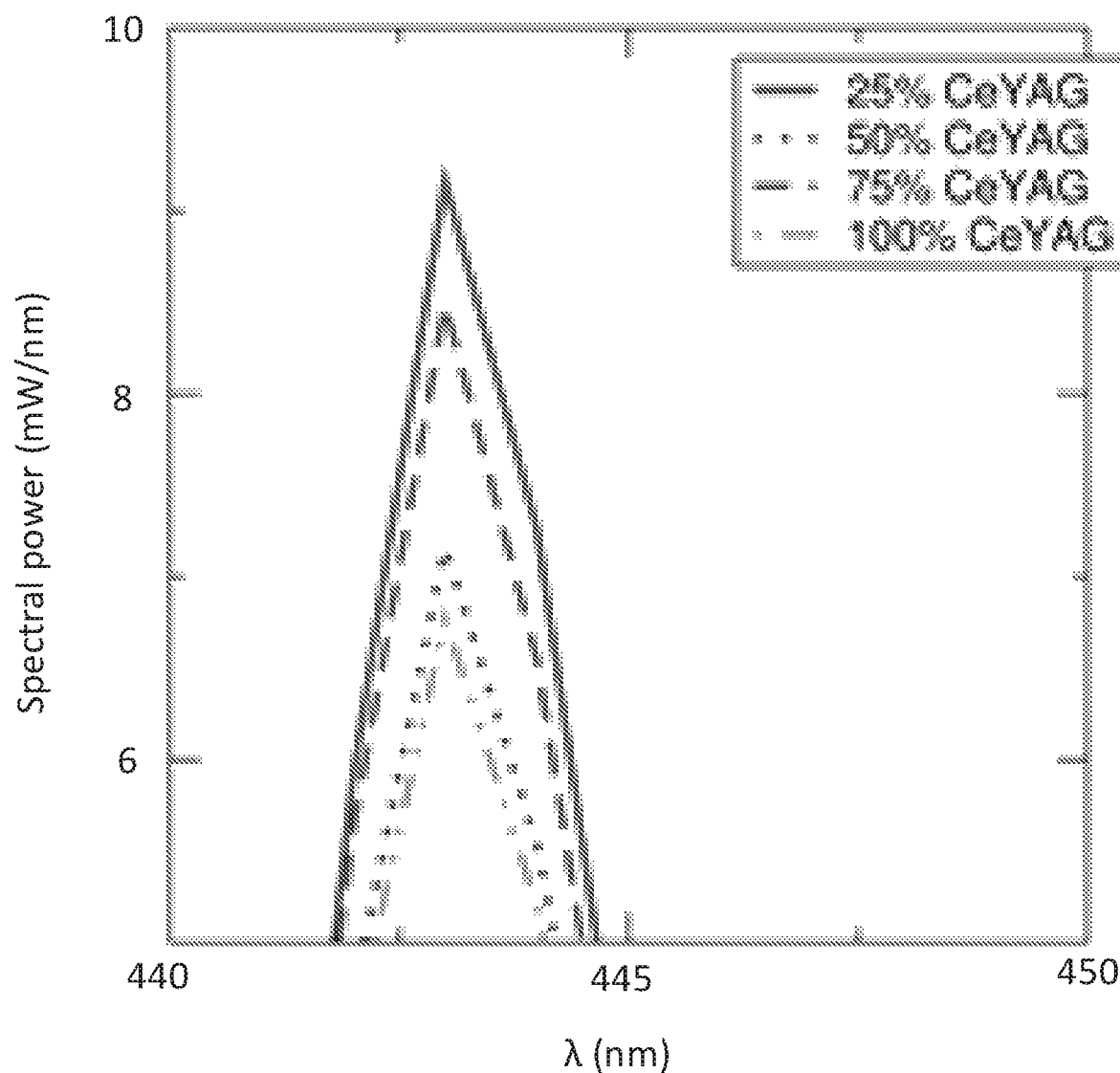
Figure 4C:
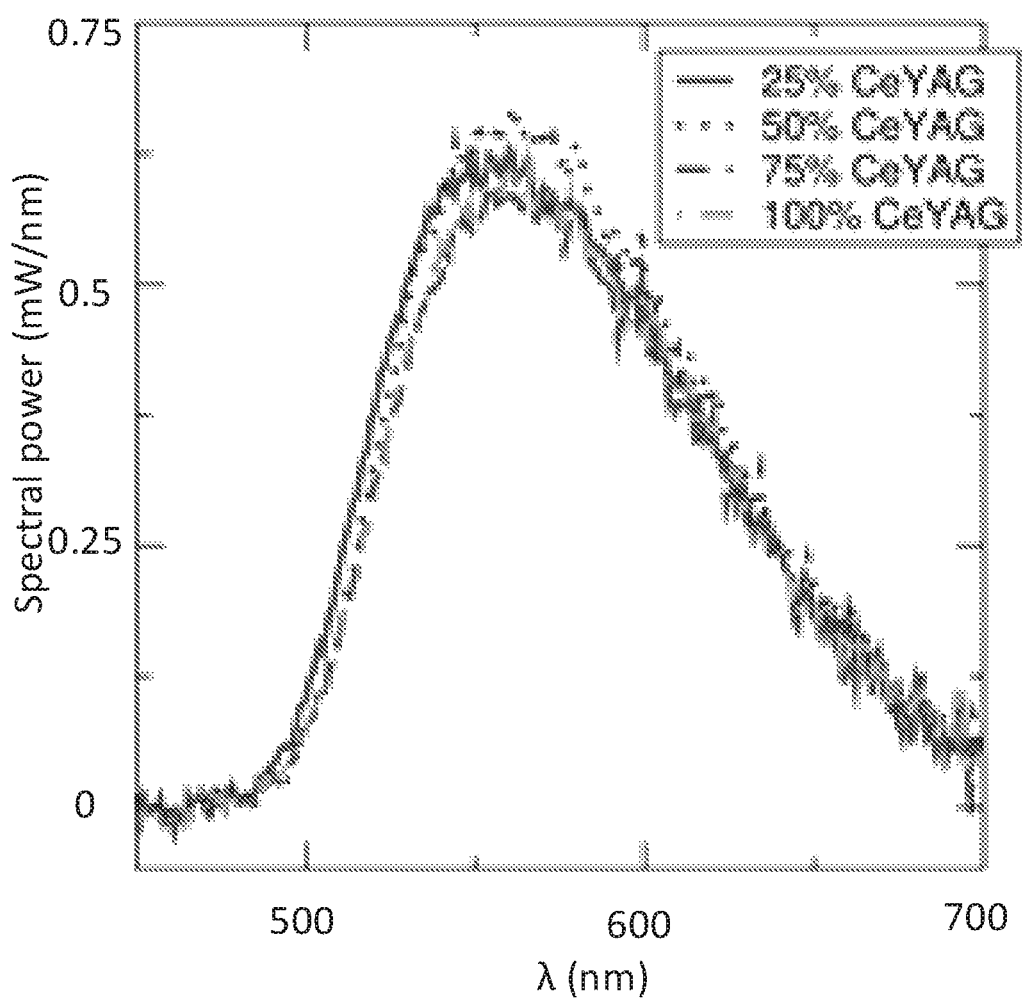

Surprisingly, the 50% Ce:YAG sample appears to work synergistically, displaying the best Correlated Color Temperature (CCT). A close look at the absorption peak (FIG. 4(b)) of the blue LD in the emission spectra shows the 100%

Ce:YAG sample absorbing the most (lowest peak intensity), with the 25% Ce:YAG sample absorbing the least (highest peak intensity). This is expected as $Al_2O_3$ very efficiently scatters blue light. What is unexpected, however, is that the scattered blue light reabsorbed by the phosphor results in a red shift of the emission profile, and the most red shifted samples are the high Ce:YAG % samples. This means that the addition of $Al_2O_3$ mitigates the effects of reabsorption of the scattered blue light, leading to an increase in the light output as compared to the sample with the Ce:YAG alone.

Comparison of Samples Before and after SPS

Reported external quantum efficiencies in the ceramic systems are less than the Ce:YAG powder by itself [19]. Phosphor mixtures were investigated both prior to SPS and post SPS preparation. For the starting Ce:YAG powder, the QY of the commercial Ce:YAG in silicone was calculated to be 83-89%, which matches expected values for this particular phosphor. A sample of 50% by weight Ce:YAG and 50% by weight $Al_2O_3$ in silicone measured a small drop in the QY to 77-86% (Table 2). QY was measured using an integrating sphere setup reported elsewhere, [2] where the ranges reported presently are minimum and maximum values measured for a range of laser powers tested. To mitigate sample heating for the phosphor powders in silicone, a 1.0 OD filter was placed in front of the LD to attenuate the LD light. It is possible that in general, ceramics with higher density prevent carbon diffusion, resulting in a higher QY for the powder, but the ceramics have similar values for QY. Conclusions about QY are difficult to make as the samples contain unknown amounts of carbon, which absorbs light. Quantitative values for carbon concentration in the present samples are very difficult as oxide and carbon standards do not exist for methods such as SIMS. While the potential interplay between QY and density are difficult to elucidate herein, the QY measured for samples of different densities were around 50%.

For transparent Ce:YAG ceramics investigated by others, the quantum efficiency of the transparent ceramics were reported to be lower than Ce:YAG powder due to waveguiding and backward emission losses [36]. In translucent or scattering Ce:YAG ceramics however, pores introduce scattering and can be controlled by tuning both the pore size and the amount of pores [37] This scattering can overcome light trapping effects of the high index of n=1.84 for Ce:YAG. In the examples illustrated herein, scattering is introduced both through the grain boundaries of the hexagonal $Al_2O_3$ mixing with cubic Ce:YAG, as well as the presence of pores.

QY was measured for ceramic samples as-prepared using SPS, and the SPS samples were then ground into powders and mixed in silicone and measured. Curiously, the measured QY of the powders in silicone derived from grinding the ceramics (69-75%) was higher than the ceramics prior to grinding (48-53%), which could be due to increased extraction by using silicone (due to different indices of refraction) or an increase in the probability for reabsorption in the silicone sample.

The increase in extraction by encapsulating the phosphor powder in silicone might also provide some reasoning as to the lower QY observed in the ceramics than the original powder, as some light might scatter but not escape the ceramic. However, the drop in QY observed is due largely to the carbon introduced via the SPS process. Other methods for preparation of ceramics, such as tape casting [38] and floating zone growth [35] might provide a more viable route for higher purity ceramic phosphors in the future, and ceramics with higher QY values have been reported for $Al_2O_3$/Ce:YAG samples [19].

Photopic Parameters

The luminous flux (Flum) with the SI unit of lumen or lm, is the light power of a white light emitting device as perceived by the human eye, and is given as follows (Eq. 1):

$$\Phi_{lum} = 683 \frac{lm}{W} \int_\lambda V(\lambda) S(\lambda) d\lambda$$

where 683 lm W-1 is a normalization factor representing the amount of lumens given by a light source of 1 W emitting at 555 nm, S ($\lambda$) is the power spectral distribution measured experimentally, and V$\lambda$) is the eye response function which represents the intensity of color perception. Luminous flux is the perceived total light output for a given emitter and phosphor combination or device and does not contain any information about the precise color of the light. The luminous efficacy of radiation (LER), which is the luminous flux divided by the radiometric/optical power of the source (lm $W_{rad}^{-1}$), provides information about how efficiently visible light is produced by a given source. This is the upper limit measurement for a given light source and phosphor combination, whereas the overall luminous efficiency, which is calculated by dividing the flux by the electrical power of the solid state emitter, provides a measure of the actual device efficiency for producing light. Luminous efficiency is measured in lm $Welec^{-1}$, and in the case of LED or LD based devices, is dictated by both the wall plug efficiency of the device and the efficiency of the phosphor. For comparison, compact bulbs and fluorescent light tubes have luminous efficiencies around 50 lm $Welec^{-1}$ to 80 lm Welec-1 [39].

Figure 5:
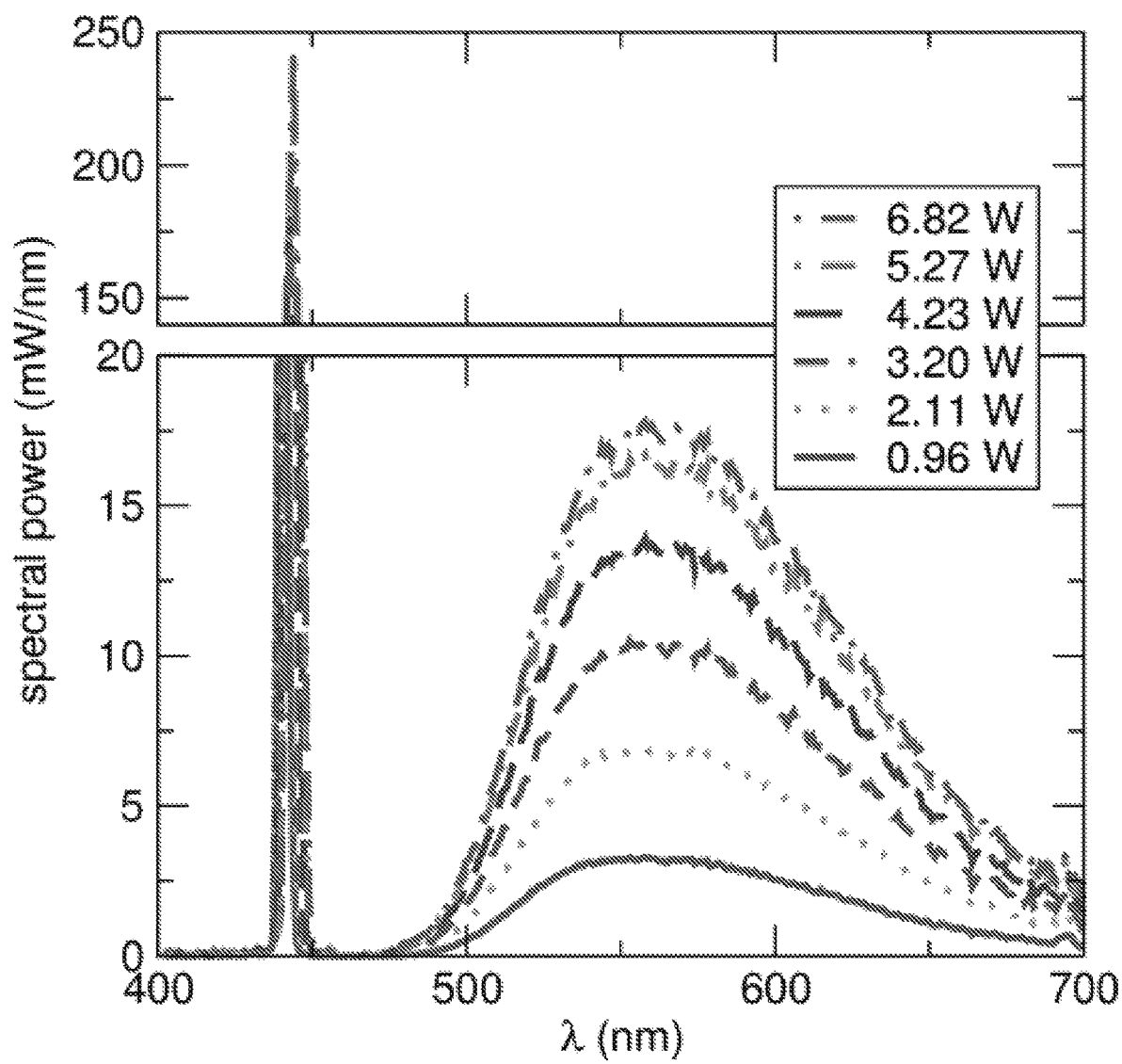
FIG. 5: spectral power distribution for increasing LD radiometric power for white light created when a 450 nm LD is incident a 50% Ce:YAG ceramic. White light is generated regardless of laser power, (0.34, 0.33) for 0.92 Wrad and (0.34, 0.32) for 6.82 Wrad.
Figure 6:
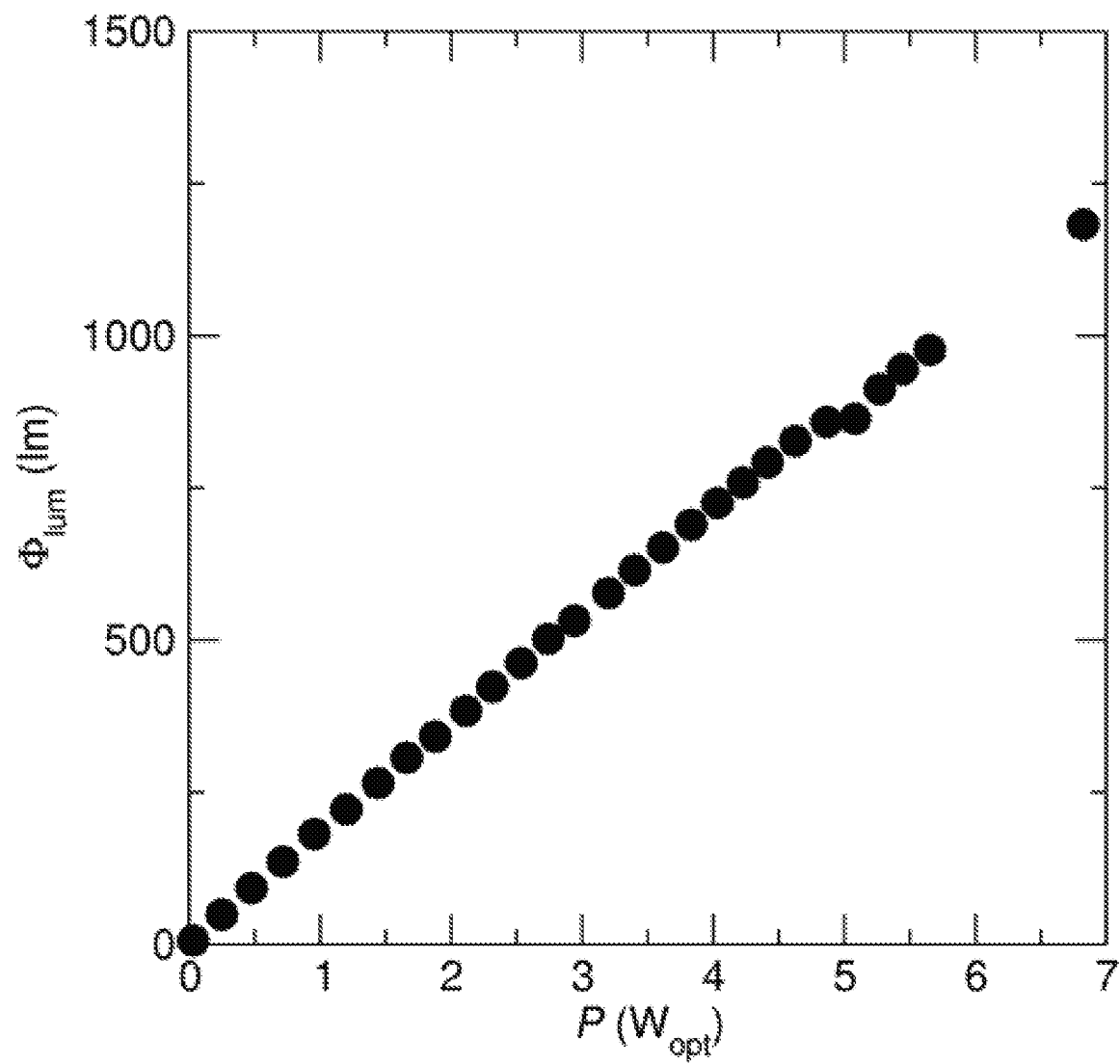
FIG. 6: Luminous flux (Φlum) as a function of LD power for a 50% Ce:YAG ceramic, where a Φlum of 1.2 klm is observed at 6.82 Wrad.

Photopic parameters of the scattering $Al_2O_3$/Ce:YAG ceramics were measured as a function of radiometric laser power. In FIG. 5, spectral power (mW $nm^{-1}$) is shown as a function of wavelength for different input powers of the blue LD tested. The spectral power reaches nearly 17 mW $nm^{-1}$ for phosphor emission, which is a factor of twenty increase from one of earlier examples of LD-excited Ce:YAG for lighting [5]. Increases observed herein are due to both higher performing lasers and phosphor morphologies capable of withstanding high flux. At the maximum measured LD output power of 6.82 W, 1.2 klm of white light was measured using an integrating sphere. Using only one phosphor sample and one commercial LD operating at maximum laser power, the 1.2 klm white light has a luminous efficacy of 165 lm $Wrad^{-1}$ with a CRI of 65, CCT of 5350 K, and CIE coordinates of (0.34, 0.32). The luminous efficiency was measured to be 51 lm $Welec^{-1}$ using a 28% WPE LD. The QY of a high-performing 50/50 sample with 84% theoretical density used in the present demonstration was 70%. For comparison, the best single chip white LEDs, with LED WPE=70%, produced roughly 600 to 640 lm at an efficiency of 150 to 178 lm $Welec^{-1}$. The demonstrations herein show that more than 1000 lm of white light can be produced by a single phosphor and solid state emitter. However, thermal management of the phosphors must first be considered to understand feasibility for steady-state operation at these high powers as well as the potential for increasing luminous flux via using multiple lasers for excitation, as roughly 25% of power is converted to heat.

Geometric Density and Thermal Conductivity

Figure 7:
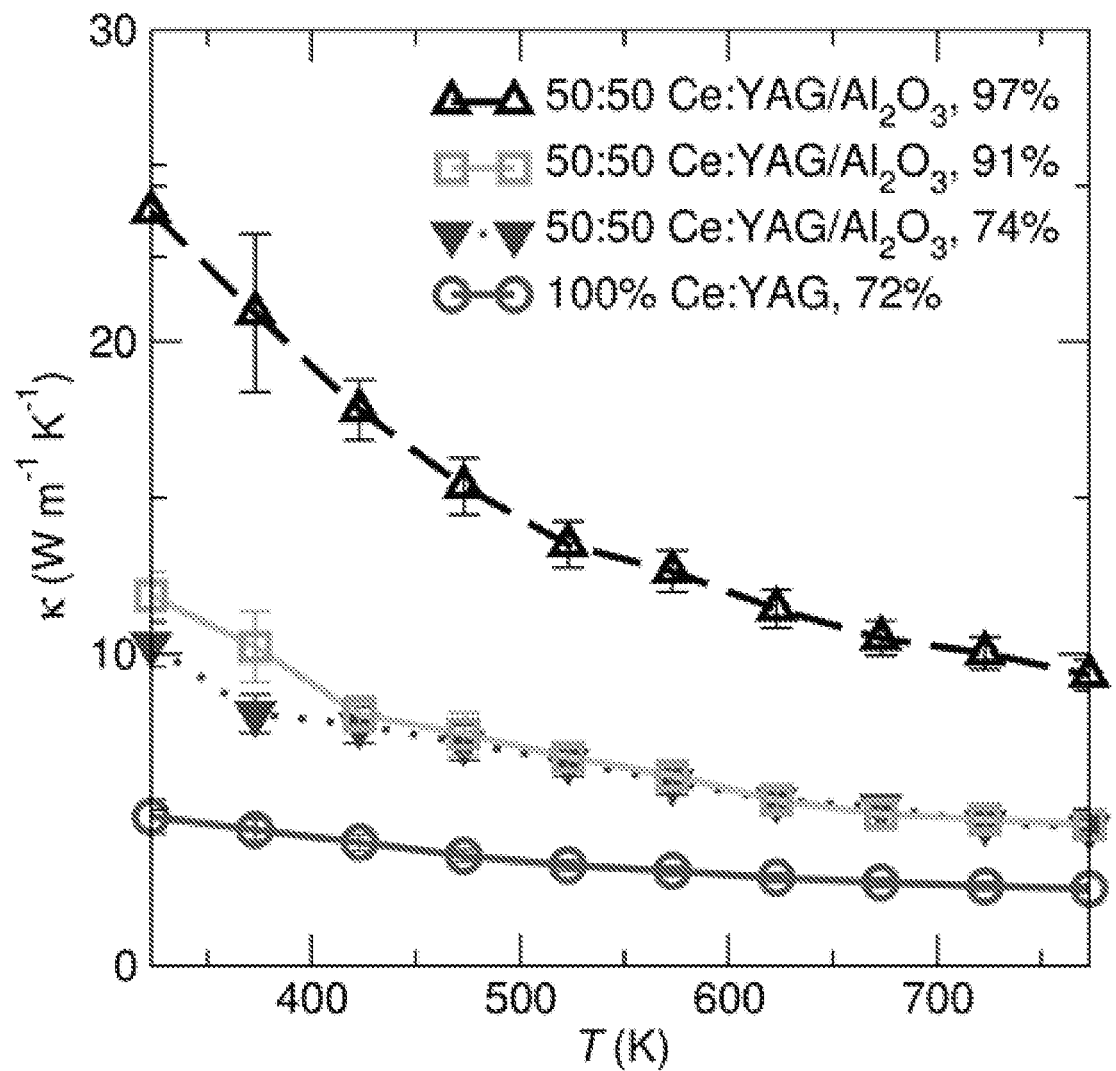
FIG. 7: Thermal conductivity as a function of temperature from 323 K to 723 K for different ceramic samples shows that including Al2O3 increases thermal conductivity in the Ce:YAG/Al2O3 ceramics, and increasing density increases thermal conductivity. Theoretical density is listed after the sample composition. As expected, the 50:50 Al2O3/Ce:YAG ceramic with the highest theoretical density has the highest thermal conductivity.

Geometric density was measured by weighing the samples and measuring their dimensions using micrometers. Theoretical densities of the samples were calculated using a weighted average of each component based on the nominal composition. To investigate the relationship between density and thermal conductivity, thermal diffusivity and heat capacity were measured from 323 K to 723 K to calculate thermal conductivity. Thermal conductivities as a function of temperature for 100% by weight Ce:YAG SPS ceramic, a 50:50 by weight Ce:YAG/$Al_2O_3$ ceramic of the same density, and 50:50 by weight Ce:YAG/Al2O3 ceramic of increasing density are shown in FIG. 7. It can be seen that for a similar theoretical density, the thermal conductivity at 323 K of a 100% Ce:YAG ceramic doubles with the inclusion of 50 weight % $Al_2O_3$. Thermal conductivity at 323 K continues to increase with increasing theoretical density and greatly surpasses values of single crystals previously reported [40].

Heat mitigation in these ceramics is therefore improved over single crystals. However, the current ceramics have QY values lower than values reported for single crystal Ce:YAG phosphors. During conversion, more heat will be generated in the present ceramics due conversion losses. Surprisingly, despite lower QY and therefore more internal heat generation, the ceramics in the present work currently outperform Ce:YAG single crystals in heat management. This may be due to the higher thermal conductivity of $Al_2O_3$. In the ceramics, benefits of the high thermal conductivity $Al_2O_3$ compete with the deleterious effects of porosity.

Both volume fraction of porosity and the size, shape, and orientation of the pores play a large role in the thermal conductivity of ceramics [41]. The change in thermal conductivity for a given temperature described herein is similar to observed values for alumina with an increase of 5-10% porosity resulting in a 5-10 W $m^{-1}$ $K^{-1}$ drop in thermal conductivity [41] which is directly related to the pore volume fraction in the composite materials.

Thermal Management Testing

In one method of testing the thermal management of the pellets, samples were irradiated using a commercial laser diode emitting 445 nm and operating at 3 W, mounted in an aluminum heat sink to mitigate laser heating, and the sample was monitored using an infrared (IR) camera. The samples were placed on a large aluminum heat sink to measure intrinsic properties of the phosphor samples and not the thermal resistance of any material holding the phosphor. The laser beam was observed to cause heating in the sample, with temperature plateauing in ~10 seconds (s) for all samples. Therefore, all IR images shown (FIGS. 8(a)-8(e)), were collected after 30 s of laser irradiation. The laser was not observed to change in efficiency during 30 s of operation, and 5 minutes (min) was taken between measurements to ensure the laser was at an equilibrium temperature with the surrounding environment before the next measurement. This was externally verified using a digital pyrometer. The maximum temperature of the Ce:YAG only sample after 30 s of laser irradiation was 90° C., which is more than the 50% Ce:YAG sample (42° C.) and the 25% Ce:YAG sample (36° C.). Therefore, the fabrication technique disclosed herein mitigates temperature very well and in non-linear way. The maximum temperatures fit better to an exponential ($r^2$=0.95) fit than a linear ($r^2$=0.85) fit, suggesting that lower concentrations of Ce:YAG will likely see small increases in temperature with increasing Ce:YAG % by weight, where values of Ce:YAG between 75% and 100% are likely to see large jumps in maximum temperature. Both sides of the cylindrical pellets were measured and differed by less than a degree in all cases. The temperatures reported here are the higher values. The low Ce:YAG composition samples are therefore better for both luminescence properties and thermal management, and also decrease the cost, as the market value for $Al_2O_3$ is $152 USD for 2.5 kg (or $0.06/g) and the market value of Ce:YAG ranges from $0.40/g to $80/g (depending on manufacturer).

Figure 9:
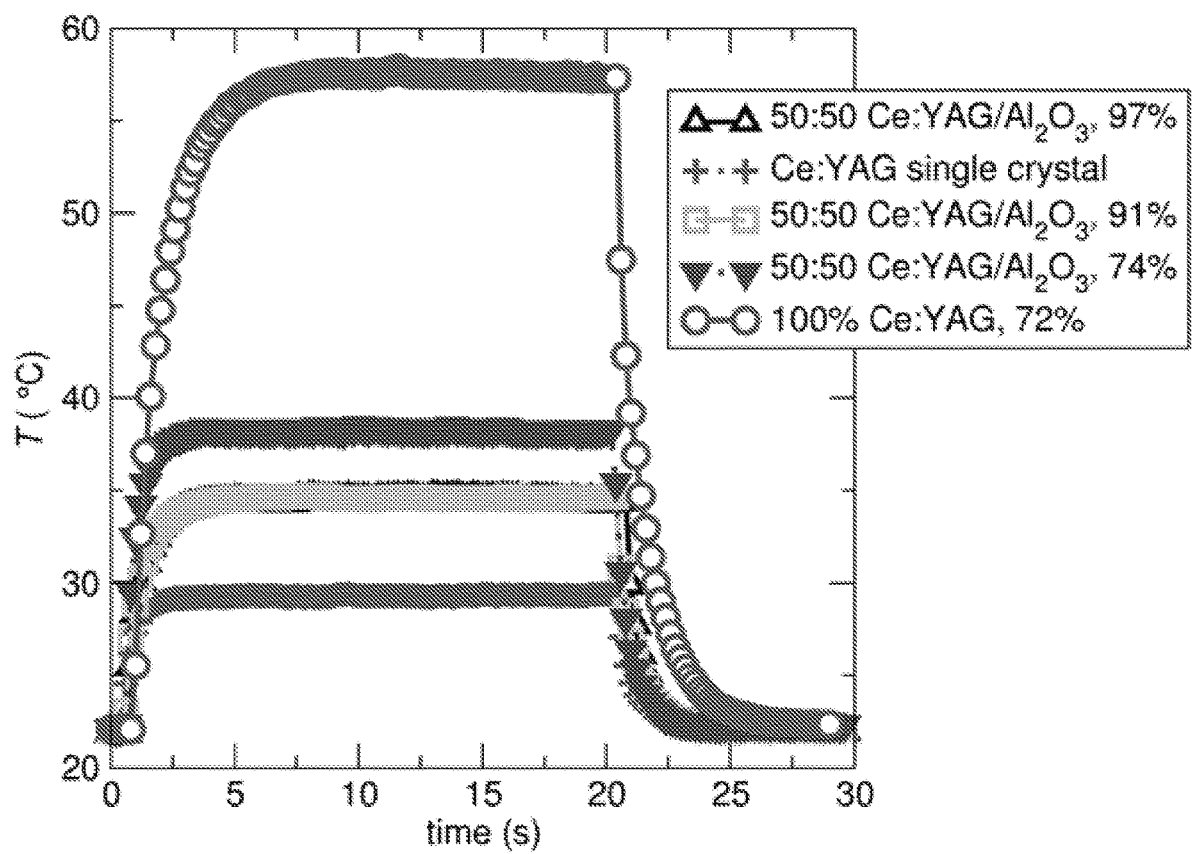
FIG. 9: Heating curves of the ceramic samples and a Ce:YAG single crystal when excited by 5 Wopt of 450 nm LD excitation are shown. Including alumina in the ceramic phosphors lowers to saturation temperature to around the same value for densities ranging from 75% to 97%. All ceramic samples had the same dimensions and were attached to a large metal heat sink using a thermal joint compound.

In another method for testing the thermal management of the ceramic composites during LD excitation, samples were irradiated using a commercial laser diode with λex=450 nm at 5 Wrad. The maximum temperature as a function of time is shown in FIG. 9. There is a great reduction in steady-state temperature from 57° C. to 37° C. by including alumina in the composite, which is enough to prevent thermal quenching in Ce:YAG for the amount of Ce-doping investigated presently [10]. Surprisingly and unexpectedly, FIG. 9 shows that, between the composite samples of varying density, there is not a large difference in steady-state temperature (less than 3° C. between ceramic composites with density of 74% and 97% despite the large differences in thermal conductivity). While the amount of heating depends on a large number of parameters such as the thermal conductivity, the QY of the phosphor, the size of the sample, how the sample is thermally fixed to a heat sink, the heat sink characteristics, etc., data presented herein demonstrates that a baseline level of thermal conductivity is required to mitigate phosphor heating in LD-excited white lighting applications. All samples measured had the same cylindrical shape with the same dimensions of 8 mm diameter and 2 mm thickness.

For LD-based white lighting, small samples are preferred for use as a quasi-point source and reducing the cost of the device. As sample size decreases, the differences in thermal conductivity will likely play a larger role. For the measurements performed herein, the samples are an order of magnitude larger in size than typical LD spot sizes, typically 300 microns. As observed herein, large increases in thermal conductivity are accompanied by small changes in the steady state temperature. Therefore, Ce:YAG/$Al_2O_3$ composites mitigate temperature very well whilst converting laser light even if the densities achieved are not the theoretical maximum. While single crystals are also actively explored, they present additional challenges with respect to color over angle when applied in reflection geometries. Therefore, one additional consideration for ceramic phosphors is how they reflect the incoming LD light, as the reflected light will play a role in both the color of a device as well as device safety.

Angular Dependent Emission Testing

Angular dependent emission was collected for a 50% $Al_2O_3$/50% Ce:YAG ceramic sample as prepared via SPS with a rough surface and Ce:YAG single crystal provided by Saint Gobain with as-prepared, not polished samples. Fundamentally, a polished surface reflects light away at the same angle as the incident light, meaning the reflected angle and incident angle are equivalent. This is his is referred to as specular reflection. A rough surface will reflect the light at more than one angle but predominantly in the same direction as the polished surface. For LD-based lighting in a reflection geometry, a matte surface might be preferred for color mixing, as blue source and yellow emitted light must mix to create white. Perfectly matte surfaces scatter light in a diffuse or Lambertian way, which means the apparent brightness is the same in every direction. While phosphor materials exhibit omnidirectional emission for the light that is absorbed and emitted, scattering of the incident light is an important consideration for making reflection-based devices [42].

Figure 10:
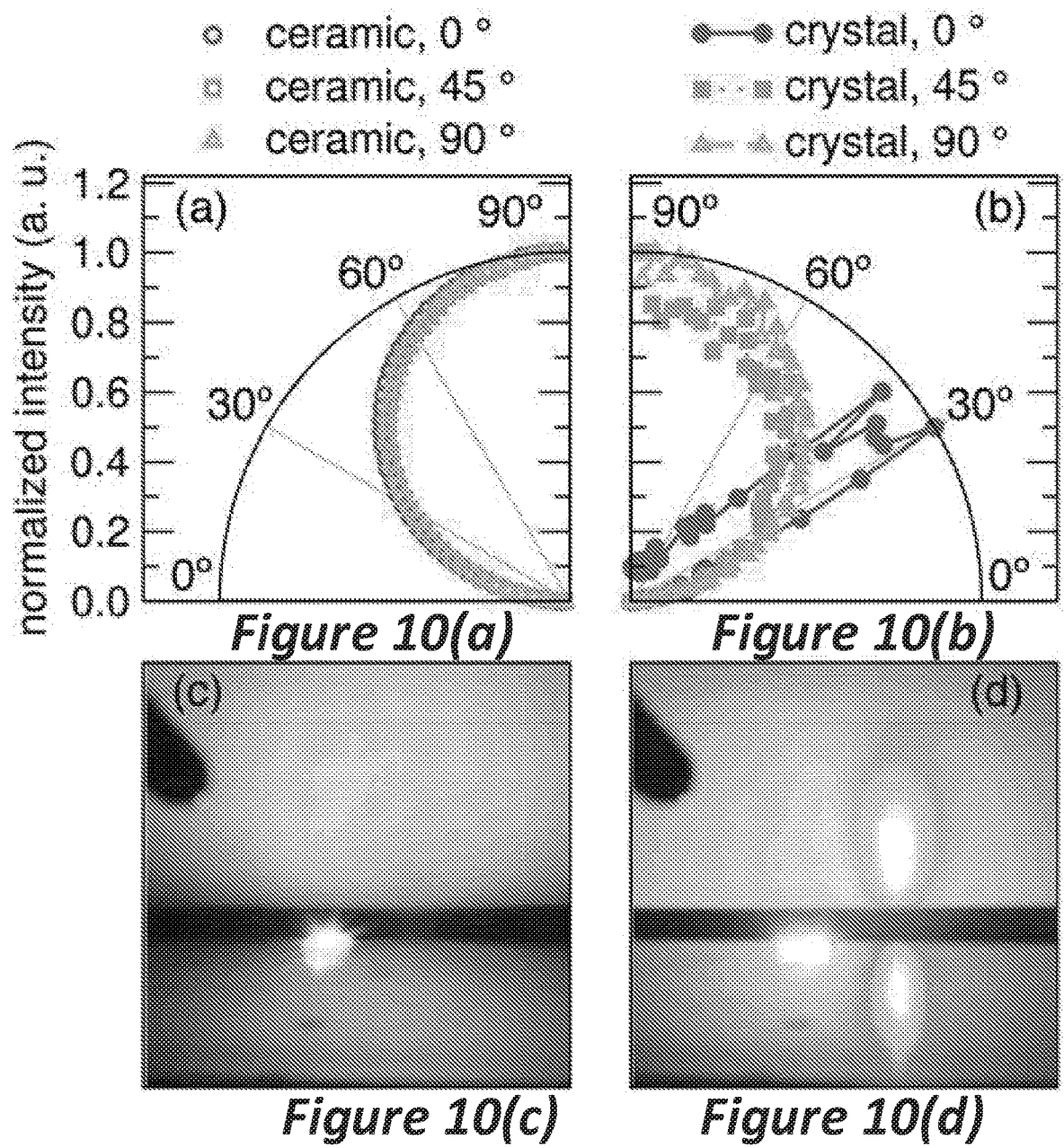
FIGS. 10(a)-10(d): Normalized emission intensity for 375 nm to 525 nm emission is shown in FIG. 10(a) for a Ce:YAG/Al2O3 ceramic composite (open shapes) and in FIG. 10(b) for a roughened Ce:YAG single crystal (closed shapes connected with lines). The samples were excited by a blue LD at 30° incident to the sample surface, and the data is shown as a function of cos(θ). Detector angles of 0°, 45°, and 90° are shown. The ceramic composite sufficiently scatters blue light rendering a uniform white color, as shown quantitatively by the isotropic luminance FIG. 10(a) and qualitatively in the photograph FIG. 10(c). The roughened single crystal reflects blue light at with the same angle as the incident LD FIG. 10(b), which leads to nonuniform emission FIG. 10(d).

The reflection geometry is considered here as a demonstration that leverages the highly scattering nature of the ceramic composites. Using a blue LD positioned at 30° incident to the phosphor, three collection angles of 0°, 450, and 90° were used to characterize the nature of the reflected blue light. It was observed that after the normal routine of surface sanding to remove the graphite foil present after SPS preparation, the Ce:YAG/$Al_2O_3$ ceramics display Lambertian reflection of incoming laser light. This is shown quantitatively in polar coordinates in FIG. 10(*a*), illustrating a diffuse blue reflection that mixes with yellow Ce:YAG emission to create white light (FIG. 10(*c*)). A Ce:YAG single crystal was subjected to the same sanding regime as the SPS ceramics in an attempt to create a matte surface, but under LD excitation displays spread blue reflection associated with a rough surface. This is shown quantitatively in FIG. 10(*b*), where the highest peak intensity of blue light is observed at the reflected angle of 30°, leading to a spread laser spot surrounded by a halo of converted yellow light (FIG. 10(*d*)). It is likely that the high hardness of the Ce:YAG single crystal prevented sufficient roughening using the attempted techniques. However, it is difficult to conclude that surface roughening alone would prevent total internal reflection in the single crystal phosphor. Therefore, the main conclusion from the results is that effort needs to be taken to texture or pattern the surface of single crystals in the attempt to produce Lambertian reflection of blue light, whereas SPS-prepared samples according to embodiments of the present invention display Lambertian emission as prepared without additional processing. Therefore, the increased thermal conductivity of ceramic composites over single crystals, as well as the Lambertian scattering achieved with no additional sample preparation render 50% $Al_2O_3$/50% Ce:YAG ceramics competitive candidates for high power LD-based lighting devices in reflection geometries, reduce cost.

Thus, the data show that by combining $Al_2O_3$ and Ce:YAG, tuning the weight percent, and consolidating using SPS, ceramic composite pellets that have higher thermal stability than CeYAG alone, high lumen output, Lambertian emission, cheaper materials cost, and faster processing, is achieved.

Example White Light Emitting Device

Figure 11:
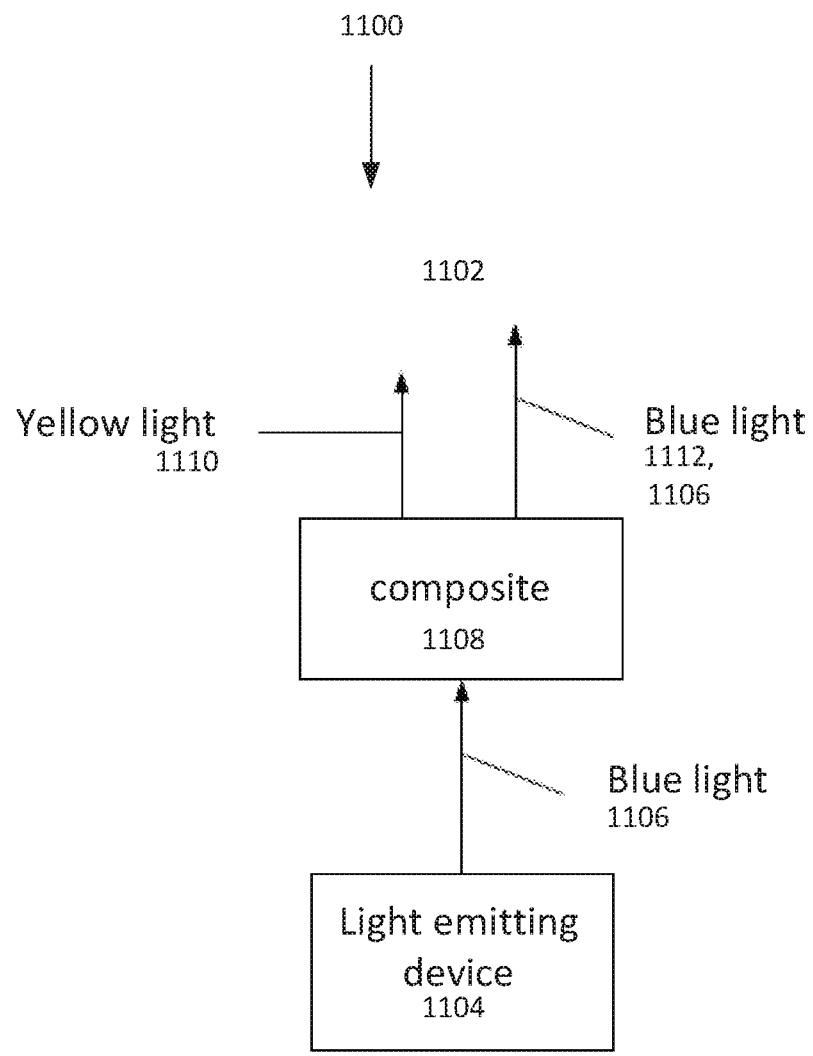
FIG. 11 is a schematic of a white light emitting device comprising a composite.

FIG. 11 illustrates a white light-emitting device 1100 for emitting white light 1102, comprising a light emitting device 1104 (e.g. laser diode (LD) or light emitting diode (LED)) that emits first electromagnetic radiation 1106 (e.g., blue light), and a composite 1108 (as illustrated in FIGS. 2(*a*)-2 (*c*) and FIGS. 3(*a*)-3(*d*)) comprising one or more phosphors (e.g., powder) sintered with one or more fillers (e.g., powder). The composite 1108 is electromagnetically coupled to the light emitting device 1104, and the composite 1108 emits second electromagnetic radiation 1110 (e.g., comprising yellow light) and scattered light 1112 in response to absorption in/scattering by the composite (e.g., by the phosphor) of the first electromagnetic radiation 1106. A combination of the first electromagnetic radiation and the second electromagnetic radiation is white light 1102. In one or more embodiments, the phosphor and the filler are sintered together using spark plasma sintering method described above. In one or more embodiments, an amount of the filler is selected to reduce an operating temperature of the phosphor material by 50 degrees, to increase an EQE (e.g., by at least 15%) of the white light emitting device, and/or result in color points and quality of the white light that is equal to or improved, as compared to without the filler. For example, such a white light emitting device can emit the white light with an EQE of at least 70%. Although the phosphor's weight can be any amount up to 100% of the weight of the composite, in one or more embodiments, the phosphor's weight is at most 60% (e.g., 25%-50%) of the weight of the composite (the remaining weight in the composite attributed to the filler).

Sintering parameters can be selected to control hardness and porosity of the composite. The sintering can produce the composite having a density >50% or >90%, for example.

In some embodiments, an encapsulant for the phosphor is not required. The apparatus can use a transmission or reflective geometry for the light/electromagnetic radiation 1106 incident on the composite 1108.

Blue lasers operate efficiently from 350 mA to a few Amps with about 5 V applied. One or more embodiments of the composite could be used with LEDs operating before droop and lasers operating above threshold (e.g., having an output power of at least 3 Watts).

In one or more embodiments, the composite 1108 is fabricated, for example, using the methods described herein, e.g., using the method illustrated in FIG. 1 and associated text.

Figure 12:
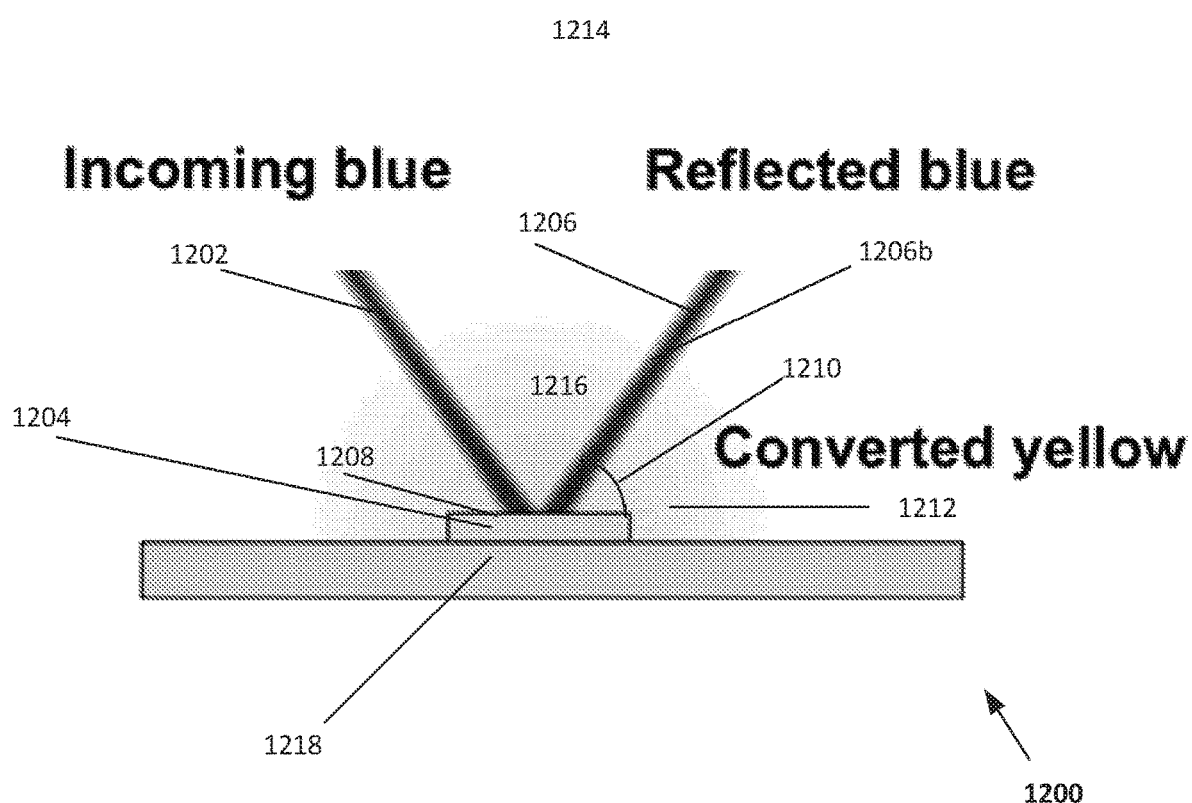
FIG. 12 is a schematic of a white light emitting device comprising a reflective geometry.

FIG. 12 shows a light emitting apparatus 1200 in a reflection geometry (e.g., emitting white light), comprising a light emitting device that emits first electromagnetic radiation 1202; and a composite 1204 (e.g., a ceramic, or one or more phosphors 302 sintered/combined with one or more fillers 304), wherein the first electromagnetic radiation 1202 is incident on the composite 1204 so as to reflect 1206 off a surface 1208 of the composite 1204 (e.g., at an angle 1210 less than 90 degrees with respect to the surface 1208 of the composite 1204, e.g., so that the first electromagnetic radiation 1202 is not incident perpendicular to the surface 1208 of the composite 1204) forming reflected light 1206*b*. The composite 1204 scatters the first electromagnetic radiation 1202 so as to form second electromagnetic radiation 1212.

In one or more embodiments, a combination of the first electromagnetic radiation 1202 and the second electromagnetic radiation 1212 is white light 1214.

In one or more embodiments, the phosphor 302 (e.g., CeYAG) is a ceramic and the filler 304 comprises a material (e.g., $Al_2O_3$) with higher thermal conductivity than the phosphor 302. the filler is $Al_2O_3$ and the phosphor is Ce:YAG.

In one or more embodiments, the phosphor's 302 weight is 25%-75% (e.g., at most 60%) of the weight of the composite 300, 1204.

In one or more embodiments, an amount of the filler 304 reduces an operating temperature of the phosphor 302, increases an EQE of the light emitting apparatus 1200, and results in color points (e.g., CIE coordinates) and quality of white light 1214 that is equal to or improved, as compared to without the filler 304.

In one or more embodiments, the composite 300, 1204 has a density of at least 50%.

In one or more embodiments, the composite 1204 is self-encapsulating.

In one or more embodiments, the light emitting device emitting the first electromagnetic radiation 1202 is a laser operating above threshold or a Light Emitting Diode operating before droop.

In one or more embodiments, the first electromagnetic radiation 1202 is blue or near UV light (below 470 nm wavelength) and the second electromagnetic radiation 1212, 1206*b* is blue, green, red, and/or yellow light.

In one or more embodiments, the composite 1204 in the device 1200 has an operating temperature reduced by at least 30%, increases an EQE of the white light emitting device 1200 by at least 15%, has a Lambertian emission 1212, and results in color points (e.g., CIE coordinates) and quality of the white light 1214 characterized by CIE coordinates within 5% of pure white light and equal to or improved as compared to the device without the filler 302.

In one or more embodiments, the surface 1208 of the composite 1204 is Lambertian, exhibiting Lambertian reflectance, so that the scattering 1216 is Lambertian scattering and the second electromagnetic radiation 1212 comprises Lambertian intensity following Lambert's cosine law.

In one or more embodiments, the light emitting device emitting the first electromagnetic radiation 1202 is a laser diode emitting the first electromagnetic radiation 1202 having a power of at least 3 Watts and the white light 1214 has a luminous flux of at least 50, at least 100, at least 200, at least 500, or 1000 lumens.

In one embodiment, the laser and composite 1204 are heat sunk separately, providing easier thermal management. In another embodiment, the phosphor material is in contact with a substrate/heat sink 1218 (whereas the transmission geometry needs a hole or space for the solid state light to travel through). More contact means better heat conduction and lower operating temperatures. Surprisingly and unexpectedly, with no surface preparation, the ceramic samples 1204 scatter the incoming blue light 1202 in a Lambertian manner, which leads to uniform color mixing and white light 1214 with excellent color coordinates (e.g., 0.34, 0.32).

In a reflection geometry, the blue light reflected 1206*b* is determined by the reflectivity of the surface 1208 of phosphor material (single crystal, ceramic, silicone, etc). Modifications can be made via waveguiding, surface roughening, etc. However, in order to achieve white light 1214, there needs to be enough conversion of the absorbed blue light 1202 to yellow that will mix with the fixed amount of reflected blue light 1208*b* to create white 1214. Simulations by the inventors/applicant of the present invention show that small samples of polished and roughened Ce:YAG single crystals cannot achieve white light because there is simply too much blue reflected. The high intensity white light achieved by ceramics in reflection geometry is therefore an unexpected result, as no surface preparation was required. The samples 1204, as prepared, scattered light uniformly to make white light. In some embodiments, after preparation by sintering, sanding, and annealing, the ceramics operate in a white light emitting device without the need for covering, coating, or encapsulation.

In one or more embodiments, the composite 1204 is fabricated using, for example the methods described herein, e.g., using the method illustrated in FIG. 1 and associated text.

Advantages and Benefits

To withstand the requirements of higher power solid-state lighting, thermally robust phosphors can be achieved by avoiding low thermal conductivity encapsulating materials altogether and creating phosphor monoliths, such as single crystals through growth [15] or dense ceramics through sintering [16-19]. Phosphor composites offer design flexibility, as sintering is not dopant amount limited such as in single crystal growth, and composites of multiple phosphors with heat dissipating materials, e.g., oxides with high thermal conductivities, can be prepared. When compared to phosphor in silicone, polycrystalline ceramics offer control of light scattering via pore size and amount tuning, reduced degradation, reduced color over angle shift, can be characterized before use with LEDs, and offer better heat conduction [20].

As illustrated herein, dense ceramics may be fabricated using spark plasma sintering (SPS). Single or multiple component samples with varying dopant amounts may also be prepared. SPS utilizes an electrical current to achieve Joule heating in powders with pressure applied concomitantly to increase contact of grains [21]. High heating rates mitigate sintering mechanisms, such as grain coarsening, and promote densification in a
process that typically takes ≈30 minutes (min), resulting in robust samples with near theoretical density possible [22]. In addition to monolithic single component phosphors, [9] composites can be made using this technique.

Moreover, as illustrated herein, the ceramic may be consolidated into a stand-alone fixture without the use of binder or encapsulant. In one or more embodiments, the consolidation is achieved by combining a filler with a phosphor using SPS and $Al_2O_3$ was chosen as the filler because it does not absorb blue or yellow light and increases the thermal management of the resulting composite (due to the thermal conductivity of $Al_2O_3$ being larger) by a factor of ~3 (Alumina, in this case $\alpha$-$Al_2O_3$ (corundum), has a thermal conductivity of 33 W/mK [48]). Indeed, as illustrated herein, the maximum temperature of the ceramic under laser flux is observed to reduce greatly (likely due to the presence of less phosphor material), with a decrease in the temperature of the ceramic as the amount of $Al_2O_3$ by weight increases. As illustrated herein, compared to phosphor powder in silicone or glass, phosphor ceramics allow for a lower operating temperature at a given device current, which results in high conversion efficiency and higher luminous output at the same operating conditions due to reduced thermal quenching. This also allows for higher power density without reaching a thermal quenching or degradation regime [20].

The use of $Al_2O_3$ introduces additional scattering, resulting in altered light propagation and extraction, whereas transparent samples waveguide light via total internal reflection. The more variable light propagation in the ceramic samples prepared herein increases the extraction efficiency.

The data presented herein also shows that different weight amounts exhibit different light output and color points when excited by a blue laser operating at 3 W. However, the relationships between relative density, thermal conductivity, and operating temperature are investigated and surprisingly reveal that large differences in thermal conductivity as a function of $Al_2O_3$ composition do not translate to significantly lower operating temperatures for the sample sizes studied.

In addition, the SPS prepared ceramic phosphor mixtures scatter light in a Lambertian manner leading to high light outputs (>1000 lm) with no further encapsulation needed when irradiated by a LD in a reflection geometry. The Lambertian scattering, achieved by samples that are not transparent due to more pores via lower density, is beneficial for reflection geometries as it randomly scatters the incoming laser light and can be leveraged in future devices to achieve better color rendering.

One key advantage to using $\alpha$-$Al_2O_3$ over other filler/composite oxides is that there are no phases between $Y_3Al_5O_{12}$ and $Al_2O_3$ on the $Y_2O_3/Al_2O_3$ phase diagram, which results in no reactivity between the two oxides during preparation of the ceramic composites. Thus, using $Al_2O_3$ prevents the formation of secondary phases, ensuring the purity of Ce:YAG in the ceramic composites produced and any mixture by weight of Ce-doped YAG and $Al_2O_3$ can be explored without impurities forming. While oxygen vacancies form in the SPS samples due to a reducing atmosphere caused by the graphite die and graphite foil used to surround the sample during SPS, the vacancies are eliminated by an additional annealing step in air. This additional treatment is a key to improving the properties of the phosphor ceramics, as oxygen vacancies serve as traps for light and decrease the efficiency of the ceramic phosphor.

Improvements in efficiency will come from improvements in processing, as well as the use of higher quality starting materials with higher QY values. One important benefit of the SPS technique is that many oxide materials, both oxide phosphors of yellow, green, and red emission and high thermal conductivity scattering oxide fillers, can be combined and sintered together. These scattering ceramics are viable candidates for LD-based white lighting. For use in devices, relationships between heat mitigation, color uniformity, and luminous flux must be considered as a function of sample size, as small samples can be leveraged to achieve quasi-point source-like behavior.

The realization of encapsulation-free phosphor ceramics is required for the next generation of laser-based white lighting due to the temperature limitations of resins and glasses. With increased light output, drastically lower operating temperatures, and good color points, these composites offer an advantage over the exemplary phosphor material alone. Additionally, diluting the exemplary phosphor material with a commodity oxide, such as $Al_2O_3$, drives the cost of starting materials down (market values for $Al_2O_3$ are currently $152 USD for 2.5 kg ($0.06/g) and the market value of Ce:YAG ranges from $0.40/g to $80/g depending on the manufacturer) while greatly improving the light output and color quality through the mechanism of reducing reabsorption. SPS is used to prepare samples of near theoretical density, which means the resulting composites are sufficiently robust for use in applications where vibrations and mechanical stress are present, such as automotive headlights. Mixing of starting oxides followed by consolidation in SPS in 30 min reduces the time necessary to make a ceramic pellet, offering large manufacturing advantages in both time and cost as compared to phosphor in glass and single crystal growth, which takes on the order of hours, is limited to making single phosphor (not composites), and is composition limited (Ce at % must be less than 0.5).

Possible Modifications

Modifications of the present invention include fabricating transparent composites and surface modifications for increased light extraction, as well as use of higher quality starting materials.

The method is not limited to fabricating composites comprising/consisting essentially of Ce:YAG as the phosphor and $Al_2O_3$ as the filler—other oxides can be used as the filler and other ceramics can be used as the phosphor. In one embodiment, a spinel phase, $MgAl_2O_4$ is mixed with Ce:YAG to make transparent ceramics [53-54]. In one or more further embodiments, a eutectic Ce:YAG is mixed with $Al_2O_3$, to form a specific composition and microstructure determined by the phase diagram of $Al_2O_3$ and YAG [55].

Basically, any white oxide powder that might scatter can be used as the filler, where the structure of the oxide determines scattering. Further examples include, but are not limited to, $TiO_2$, maybe ZnO (although ZnO is used in sunblocks because it absorbs), $MgAl_2O_4$, etc.

Other sintering techniques can be used and other steps can be added during the fabrication process. One or more embodiments of the present invention have also identified that pressing with subsequent sintering, injection molding, hot pressing, and isostatic pressing [56] are all techniques different from SPS and that can be used to combine the filler and the phosphor to make dense samples and in a similar way. Other materials compatible with these processes that are potential filler oxides for use in one or more embodiments of the invention, include, but are not limited to, $ZrO_2$, $Y_2O_3$, $Sc_2O_3$, $Lu_2O_3$, AlON, etc.

Acknowledgments

Use of the facilities at the Structural Materials Processing Laboratory at UCSB is gratefully acknowledged.

REFERENCES

The following references are incorporated by reference herein:
(1) Kuritzky, L. Y.; Speck, J. S. Lighting for the 21st century with laser diodes based on non-basal plane orientations of GaN. MRS Communications 2015, 5, 463-473.
(2) Cantore, M.; Pfaff, N.; Farrell, R. M.; Speck, J. S.; Nakamura, S.; DenBaars, S. P. High luminous flux from single crystal phosphor-converted laser-based white lighting system. Opt. Express 2016, 24, A215-A221.
(3) Wierer, J. J.; Tsao, J. Y.; Sizov, D. S. Comparison between blue lasers and light-emitting diodes for future solid-state lighting. Laser Photon. Rev. 2013, 7, 963-993.
(4) Murota, R.; Kobayashi, T.; Mita, Y. Solid state light source fabricated with YAG: Ce single crystal. Japanese journal of applied physics 2002, 41, L887.
(5) Denault, K. A.; Cantore, M.; Nakamura, S.; Denbaars, S. P.; Seshadri, R. Efficient and stable laser-driven white lighting. AIP Adv. 2013, 3.
(6) George, N. C.; Denault, K. A.; Seshadri, R. Phosphors for Solid-State White Lighting. Annu. Rev. Mater. Res. 2013, 43, 481-501.
(7) Birkel, A.; Denault, K. A.; George, N. C.; Doll, C. E.; Hery, B.; Mikhailovsky, A. A.; Birkel, C. S.; Hong, B.-C.; Seshadri, R Rapid microwave preparation of highly efficient Ce3+-substituted garnet phosphors for solid state white lighting. Chem. Mater. 2012, 24, 1198-1204.
(8) Fujita, S.; Yoshihara, S.; Sakamoto, A.; Yamamoto, S.; Tanabe. S. YAG glass-ceramic phosphor for white LED (I): background and development. Opt. Photonics 2005; pp 594111-594117.
(9) Cozzan, C.; Brady, M. J.; O'Dea, N.; Levin, E. E.; Nakamura, S.; DenBaars, S. P.; Seshadri, R. Monolithic translucent BaMgAl10O17:Eu2+ phosphors for laser-driven solid state lighting. AIP Advances 2016, 6, 105005.
(10) Bachmann, V.; Ronda, C.; Meijerink, A. Temperature Quenching of Yellow Ce3+ Luminescence in YAG:Ce. Chem. Mater. 2009, 21, 2077-2084.
(11) Ueda, J.; Dorenbos, P.; Bos, A. J.; Meijerink, A.; Tanabe, S. Insight into the thermal quenching mechanism for Y3Al5O12:Ce3+ through thermoluminescence excitation spectroscopy. The Journal of Physical Chemistry C 2015, 119, 25003-25008.
(12) Latynina, A.; Watanabe, M.; Inomata, D.; Aoki, K.; Sugahara, Y.; Villora, E. G.; Shi-mamura, K. Properties of Czochralski grown Ce, Gd:Y3Al5O12 single crystal for white light-emitting diode. J. Alloys Compd. 2013, 553, 89-92.
(13) Tanabe, S.; Fujita, S.; Yoshihara, S.; Sakamoto, A.; Yamamoto, S. YAG glass-ceramic phosphor for white LED (II): luminescence characteristics. Optics & Photonics 2005; pp 594112-594112.
(14) Kim, E.; Unithrattil, S.; Sohn, I. S.; Kim, S. J.; Chung, W. J.; Im, W. B. Facile one-step fabrication of 2-layered and 4-quadrant type phosphor-in-glass plates for white LEDs: an insight into angle dependent luminescence. Optical Materials Express 2016, 6, 804-814.
(15) Arjoca, S.; V'illora, E. G.; Inomata, D.; Aoki, K.; Sugahara, Y.; Shima-mura, K. Ce:(Y1-xLux)Al5O12 single-crystal phosphor plates for high-brightness white

(16) Frage, N.; Kalabukhov, S.; Sverdlov, N.; Ezersky, V.; Dariel, M. P. Densification of transparent yttrium aluminum garnet (YAG) by SPS processing. J. Eur. Ceram. Soc. 2010, 30, 3331-3337.

(17) He, L.-f.; Fan, G.-h.; Lei, M.-y.; Lou, Z.-l.; Zheng, S.-w.; Su, C.; Xiao, Y.; Chen, Z.-w.; Zhang, T. Luminescent Properties of New MgAl2O4CeYAG Transparent Ceramics for White LED Applications. Chinese J. Lumin. 2013, 2, 3.

(18) Shen, L.; Li, Y.; Huang, Q. Ultrafast fabrication of solid phosphor based white light emitting diodes: From powder synthesis to devices. Appl. Phys. Lett. 2013, 103, 121908.

(19) Li, S.; Zhu, Q.; Tang, D.; Liu, X., Ouyang, G.; Cao, L.; Hirosaki, N.; Nishimura, T.; Huang, Z.; Xie, R.-J. Al2O3-YAG:Ce composite phosphor ceramic: a thermally robust and efficient color converter for solid state laser lighting. Journal of Materials Chemistry C 2016,

(20) Raukas, M.; Kelso, J.; Zheng, Y.; Bergenek, K.; Eisert, D.; Linkov, A.; Jermann, F. Ceramic phosphors for light conversion in LEDs. ECS Journal of Solid State Science and Technology 2013, 2, R3168-R3176.

(21) Nygren, M.; Shen, Z. On the preparation of bio-, nano- and structural ceramics and composites by spark plasma sintering. Solid State Sciences 2003, 5, 125-131.

(22) Garay, J. E. Current-activated, pressure-assisted densification of materials. Annu. Rev. Mater. Res. 2010, 40, 445-468.

(23) Sakata, S.-i.; Mitani, A.; Fujii, I. Light conversion structure and light-emitting device using the same; 2011.

(24) Sai, Q.; Zhao, Z.; Xia, C.; Xu, X.; Wu, F.; Di, J.; Wang, L. Ce-doped Al2O3-YAG eutectic and its application for white LEDs. Optical Materials 2013, 35, 2155-2159.

(25) Tang, Y.; Zhou, S.; Chen, C.; Yi, X.; Feng, Y.; Lin, H.; Zhang, S. Composite phase ceramic phosphor of Al2O3-Ce:YAG for high efficiency light emitting. Optics Express 2015, 23, 17923-17928.

(26) Yoshimura, M.; Sakata, S.-i.; Iba, H.; Kawano, T.; Hoshikawa, K. Vertical Bridgman growth of Al2O3/YAG: Ce melt growth composite. Journal of Crystal Growth 2015, 416, 100-105.

(27) Song, Y. H.; Ji, E. K.; Jeong, B. W.; Jung, M. K.; Kim, E. Y.; Lee, C. W.; Yoon, D. H. Design of laser-driven high-efficiency Al2O3/YAG: Ce3+ ceramic converter for automotive lighting: Fabrication, luminous emittance, and tunable color space. Dyes and Pigments 2017, 139, 688-692.

(28) Abell, J.; Harris, I.; Cockayne, B.; Lent, B. An investigation of phase stability in the Y2O3-Al2O3 system. Journal of Materials Science 1974, 9, 527-537.

(29) Munro, R G. Evaluated Material Properties for a Sintered alpha-Alumina. Journal of the American Ceramic Society 1997, 80, 1919-1928.

(30) Larson, A. C.; Von Dreele, R. B. GSAS. General Structure Analysis System. LANSCE, MS-H805, Los Alamos, N. Mex. 1994,

(31) Toby, B. H. EXPGUI, a Graphical User Interface for GSAS. J. Appl. Crystallogr. 2001, 34, 210-213.

(32) Leyre, S.; Coutino-Gonzalez, E.; Joos, J.; Ryckaert, J.; Meuret, Y.; Poelman, D.; Smet, P.; Durinck, G.; Hofkens, J.; Deconinck, G.; Hanselaer, P. Absolute determination of photoluminescence quantum efficiency using an integrating sphere setup. Review of scientific instruments 2014, 85, 123115.

(33) Cowan, R. D. Pulse method of measuring thermal diffusivity at high temperatures. J. Appl. Phys. 1963, 34, 926-927.

(34) Morita, K.; Kim, B.-N.; Yoshida, H.; Hiraga, K.; Sakka, Y. Influence of pre- and post-annealing on discoloration of MgAl204 spinel fabricated by spark-plasma-sintering (SPS). Journal of the European Ceramic Society 2016, 36, 2961-2968.

(35) Sai, Q.; Xia, C. Tunable colorimetric performance of Al2O3-YAG:Ce3+ eutectic crystal by Ce3+ concentration. J. Lumin. 2017, 186, 68-71.

(36) Shi, H.; Chen, J.; Huang, J.; Hu, Q.; Deng, Z.; Cao, Y.; Yuan, X. Preparation and luminescence properties of YAG: Ce phosphor for white LED application via a vacuum sintering method. physica status solidi (a) 2014, 211, 1596-1600.

(37) Bechtel, H.; Schmidt, P. J.; Tücks, A.; Heidemann, M.; Chamberlin, D.; Müller-Mach, R.; Müller, G. O.; Shchekin, O. Fully phosphor-converted LEDs with Lumiramic phosphor technology. SPIE Optical Engineering+ Applications. 2010; pp 77840W-77840W.

(38) Chen, J.; Lan, H.; Cao, Y.; Deng, Z.; Liu, Z.; Tang, F.; Guo, W. Application of composite phosphor ceramics by tape-casting in white light-emitting diodes. Journal of Alloys and Compounds 2017, 709, 267-271.

(39) Schubert, E. F. Light emitting diodes; Wiley Online Library, 2006.

(40) Arjoca, S.; V'illora, E. G.; Inomata, D.; Aoki, K.; Sugahara, Y.; Shimamura, K. Temperature dependence of Ce:YAG single-crystal phosphors for high-brightness white LEDs/LDs. Mater. Res. Express 2015, 2, 55503.

(41) Francl, J.; Kingery, W. Thermal conductivity: IX, experimental investigation of effect of porosity on thermal conductivity. Journal of the American Ceramic Society 1954, 37, 99-107.

(42) Leung, V.; Lagendijk, A.; Tukker, T.; Mosk, A.; IJzerman, W.; Vos, W. Interplay between multiple scattering, emission, and absorption of light in the phosphor of a white light-emitting diode. Optics Express 2014, 22, 8190-8204.

(43) N. C. George, K. A. Denault, and R. Seshadri, "Phosphors for Solid-State White Lighting," Annu. Rev. Mater. Res., vol. 43, no. 1, pp. 481-501, 2013.

(44). S. Arjoca, E. G. Villora, D. Inomata, K. Aoki, Y. Sugahara, and K. Shimamura, "Ce:$(Y_{1-x}Lu_x)_3Al_5O_{12}$ single-crystal phosphor plates for high-brightness white LEDs/LDs with high-color rendering ($R_a$>90) and temperature stability," Mater. Res. Express, vol. 1, no. 2, p. 025041, 2014.

(45). S. Fujita, S. Yoshihara, A. Sakamoto, S. Yamamoto, and S. Tanabe, "YAG glass-ceramic phosphor for white LED (I): background and development," in Opt. Photonics 2005, p. 594111, International Society for Optics and Photonics, 2005.

(46). D. Chen, W. Xiang, X. Liang, J. Zhong, H. Yu, M. Ding, H. Lu, and Z. Ji, "Advances in transparent glass-ceramic phosphors for white light-emitting diodes-A review," J. Eur. Ceram. Soc., vol. 35, no. 3, pp. 859-869, 2015.

(47). J. E. Garay, "Current-activated, pressure-assisted densification of materials," Annu. Rev. Mater. Res., vol. 40, pp. 445-468, 2010.

(48). R. G. Monro, "Evaluated material properties for a sintered α-alumina," J. Am. Ceram. Soc., vol. 80, pp. 1919-1928, 1997.

(49) Y.-S. Kim, S.-W. Choi, J.-H. Park, E. Bok, B.-K. Kim, and S.-H. Hong, "Red-Emitting (Sr,Ca)AlSiN$_3$:Eu$^{2+}$ Phosphors Synthesized by Spark Plasma Sintering," *ECS J. Solid State Sci. Technol.*, vol. 2, no. 2, pp. R3021-R3025, 2012.
(50). H.-S. Do, S.-W. Choi, and S.-H. Hong, "Blue-emitting AlN:$Eu^{2+}$ Powder Phosphor Prepared by Spark Plasma Sintering," *J. Am. Ceram. Soc.*, vol. 93, no. 2, pp. 356-358, 2010.
(51). S.-W. Choi and S.-H. Hong, "Luminescence Properties of $Eu^{2+}$-Doped Ca-α-SiAlON Synthesized by Spark Plasma Sintering," *J. Electrochem. Soc.*, vol. 157, no. 8, J297, 2010.
(52). S. W. Choi, Y. J. Kim, and S.-H. Hong, "Green-emitting $Yb^{2+}$-doped SiAlON phosphors prepared by spark plasma sintering," *Opt. Mater.*, vol. 33, no. 11, pp. 1700-1703, 2011.
(53). L.f. He, G.-h. Fan, M.-y. Lei, Z.-l. Lou, S.-w. Zheng, C. Su, Y. Xiao, Z.-w. Chen, and T. Zhang, "Luminescent Properties of New $MgAl_2O_4$/Ce:YAG Transparent Ceramics for White LED Applications," *Chinese J. Lumin.*, vol. 2, 2013.
(54). L. Shen, Y. Li, and Q. Huang, "Ultrafast fabrication of solid phosphor based white light emitting diodes: From powder synthesis to devices," *Appl. Phys. Lett.*, vol. 103, 121908, 2013.
(55). Q. Sai, Z. Z. Zhao, C. Xia, X. Xu, F. Wu, J. Di, L. Wang, Ce-doped $Al_2O_3$-YAG eutectic and its application for white LEDs," *Opt. Mater.*, vol. 35, no. 12, pp. 2155-2159, 2013.
(56). A. A. Kachaev. D. V. Grashchenkov, Y. E. Lebedeva, S. S. Solntsev, O. L. Khasanov, "Optically Transparent Ceramic (Review)," *Glass Ceram.*, pp. 1-7, 2016.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. A method for fabricating a composite, comprising:
mixing a phosphor and a filler to form a mixture;
sintering the mixture to form a composite; and
annealing the composite at one or more first temperatures and for a duration wherein a carbon content in the composite is reduced by at least an order of magnitude and the composite scatters electromagnetic radiation so as to form white light.
2. The method of claim 1, wherein:
the phosphor is an oxide phosphor that can withstand a second temperature and atmosphere used in the sintering,
the filler is any oxide with higher thermal conductivity than the phosphor, and
the filler serves to scatter instead of absorb light.
3. The method of claim 1, wherein the phosphor comprises Ce:YAG and the filler comprises $Al_2O_3$.
4. The method of claim 1, wherein the composite comprises a phosphor:filler ratio having any ratio by weight.
5. The method of claim 1, wherein a first weight of the phosphor in the composite is at most 50% of a second weight of the composite and a second temperature of the sintering is increased with increasing content of the phosphor in the composite.
6. The method of claim 1, wherein:
the sintering is spark plasma sintering, the sintering forms the composite that has a first color that is dark, as compared to a color of the mixture prior to the sintering,
the one or more temperatures and the duration are such that the composite has a second color after the annealing, and
the second color appears closer to the color of the mixture prior to the sintering.
7. A method for fabricating a composite, comprising:
mixing a phosphor or phosphors and a filler or fillers to form a mixture; and
sintering the mixture to form a composite, wherein:
the sintering comprises rapidly heating the mixture under a pressure,
a temperature of the mixture is increased at a rate of <500 degrees Celsius per minute and held at a maximum temperature less than the melting temperature of the constituents in the mixture,
the pressure is in a range of <10 KN, and
the sintering is performed in a time of 5 hours or less; and
annealing the composite at a temperature of at least 1000° C. for at least 3 hours; and
so that the composite, as prepared, scatters incident electromagnetic radiation having a power of at least 3 Watts so as to form a white light having a luminous flux of at least 100 lumens.
8. A white light-emitting device for emitting white light, comprising:
a light emitting device that emits a first electromagnetic radiation; and
a composite on a substrate, the composite comprising a phosphor sintered with a filler and coupled to the light emitting device in a reflection geometry, wherein:
the first electromagnetic radiation is incident on the composite from a first side of the substrate so as to reflect off a surface of the composite at an angle less than 90 degrees with respect to the surface of the composite,
the composite scatters the first electromagnetic radiation so as to form Lambertian scattering comprising the first electromagnetic radiation and a second electromagnetic radiation having a Lambertian intensity following Lambert's cosine law; and
a combination of the first electromagnetic radiation and the second electromagnetic radiation is white light emitted only towards the first side.
9. The white light-emitting device of claim 8, wherein the phosphor is a ceramic and the filler comprises a material with higher thermal conductivity than the phosphor.
10. The white light-emitting device of claim 8, wherein the filler is $Al_2O_3$ and the phosphor is Ce:YAG.
11. The white light-emitting device of claim 8, wherein the phosphor's weight is 25%-75% of a weight of the composite such that the white light has color points and a quality characterized by CIE coordinates within 5% of pure white light.
12. The white light-emitting device of claim 8, wherein the phosphor's weight is at most 60% of a weight of the composite.
13. The white light-emitting device of claim 8, wherein an amount of the filler reduces an operating temperature of the phosphor, increases an external quantum efficiency of the white light-emitting device, and results in color points and quality of white light that is equal to or improved, as compared to without the filler.

14. The white light-emitting device of claim 8, wherein the composite has a density of at least 50%.

15. The white light-emitting device of claim 8, wherein the composite is self-encapsulating.

16. The white light-emitting device of claim 8, wherein the light emitting device is a laser operating above threshold or a Light Emitting Diode operating before droop and the light emitting device is positioned to a side of the composite that is not in a path of the white light.

17. The white light-emitting device of claim 8, wherein the first electromagnetic radiation is blue or near ultraviolet (UV) light and the second electromagnetic radiation is blue, green, red, and/or yellow light and the light emitting device is coupled to the composite in the reflection geometry so that a majority of the first electromagnetic radiation is reflected from or scattered away from the composite.

18. The white light-emitting device of claim 8, wherein the composite in the white light-emitting device:

has an operating temperature reduced by at least 30%, increases an external quantum efficiency of the white light emitting device by at least 15%, has a Lambertian emission, results in color points and quality of the white light characterized by CIE coordinates within 5% of pure white light and equal to or improved as compared to the device without the filler.

19. The white light-emitting device of claim 8, wherein the surface of the composite is Lambertian, exhibiting Lambertian reflectance, so that the scattering is the Lambertian scattering and the second electromagnetic radiation comprises the Lambertian intensity following the Lambert's cosine law.

20. The white light-emitting device of claim 8, wherein the light emitting device is a laser diode emitting the first electromagnetic radiation having a power of at least 3 Watts, the white light has a luminous flux of at least 100 lumens, the light emitting device is positioned to a side of the composite that is not in a path of the white light, and the substrate is a heat sink for thermal management of heat generated by the first electromagnetic radiation.

* * * * *